(12) United States Patent
Morong et al.

(10) Patent No.: US 7,965,064 B2
(45) Date of Patent: *Jun. 21, 2011

(54) POWER CONVERSION REGULATOR WITH PREDICTIVE ENERGY BALANCING

(75) Inventors: William H. Morong, Paoli, PA (US); Thomas E. Lawson, Malvern, PA (US)

(73) Assignee: Lawson Labs, Inc., Malvern, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/621,664

(22) Filed: Nov. 19, 2009

(65) Prior Publication Data

US 2010/0066335 A1    Mar. 18, 2010

Related U.S. Application Data

(63) Continuation of application No. 11/593,702, filed on Nov. 6, 2006, now Pat. No. 7,642,758.

(60) Provisional application No. 60/734,068, filed on Nov. 7, 2005, provisional application No. 60/739,564, filed on Nov. 23, 2005, provisional application No. 60/771,769, filed on Feb. 9, 2006, provisional application No. 60/774,413, filed on Feb. 17, 2006.

(51) Int. Cl.
*G05F 1/40*  (2006.01)
*G05F 1/70*  (2006.01)

(52) U.S. Cl. ........ 323/206; 323/208; 323/284; 323/285; 323/290

(58) Field of Classification Search .................... 363/13, 363/15, 16, 21.01, 131; 323/205–211, 282–287, 323/290; 173/1, 2, 217; 318/254, 701; 324/207.16, 324/207.25

See application file for complete search history.

(56) References Cited

U.S. PATENT DOCUMENTS

| | | | |
|---|---|---|---|
| 3,636,430 A | 1/1972 | Kernick et al. | |
| 3,781,653 A | 12/1973 | Marini | |
| 4,084,103 A | 4/1978 | Burns, III et al. | |
| 5,072,355 A | 12/1991 | Huillet | |
| 5,612,596 A | 3/1997 | Wiese | |
| 5,703,456 A | 12/1997 | Cox | |
| 5,825,164 A | 10/1998 | Williams | |
| 5,978,195 A | 11/1999 | Goder et al. | |
| 6,130,526 A * | 10/2000 | Yang et al. | 323/284 |
| 6,188,206 B1 * | 2/2001 | Nguyen et al. | 323/283 |
| 6,285,568 B1 | 9/2001 | Taurand | |
| 6,456,514 B1 | 9/2002 | Perreault et al. | |
| 6,894,471 B2 * | 5/2005 | Corva et al. | 323/285 |
| 7,642,758 B2 * | 1/2010 | Morong et al. | 323/206 |
| 2004/0245983 A1 | 12/2004 | Mayes | |
| 2005/0073862 A1 | 4/2005 | Mednik et al. | |

* cited by examiner

OTHER PUBLICATIONS

International Searching Authority, International Search Report, Mar. 25, 2008.

*Primary Examiner* — Jessica Han
(74) *Attorney, Agent, or Firm* — Rudoler & DeRosa LLC

(57) ABSTRACT

A power-conversion regulator comprising an inductive reactor, an output filter reactor, and a switch for admitting energy to the inductive reactor, additionally comprises computation circuitry responsive to the flux in the inductive reactor, to a reference signal, to an output voltage, and sometimes to an output load current, for computing the quantity of energy that must be supplied to a load and to the output filter reactor to regulate the output voltage or current to a desired relationship with the reference signal during each chopping waveform cycle driving the switch. As the inductive reactor is charged from an input energy source, the computation circuitry predicts whether the energy in the inductive reactor has become adequate for the regulation.

24 Claims, 24 Drawing Sheets

POWER CONVERSION REGULATOR WITH PREDICTIVE ENERGY BALANCING

CROSS-REFERENCE TO RELATED APPLICATIONS

This is a continuation of application Ser. No. 11/593,702, filed Nov. 6, 2006, incorporated herein by reference, which claims the benefit of U.S. Provisional Application Nos. 60/734,068, filed on Nov. 7, 2005, 60/739,564 filed on Nov. 23, 2005, 60/771,769 filed on Feb. 9, 2006 and 60/774,413 filed on Feb. 17, 2006, all of which are incorporated herein by reference.

STATEMENT REGARDING FEDERALLY SPONSORED RESEARCH OR DEVELOPMENT

The present invention was not developed with the use of any Federal Funds, but was developed independently by the inventors.

BACKGROUND OF THE INVENTION

It is often desirable to convert electrical energy sources from some arbitrary voltage to another arbitrary voltage or current. With high enough input voltages, simple linear regulation is often adequate, but often wastes power. For higher efficiency, and for voltages or compliances higher than the input voltage, either the input energy must be AC, or if DC, it must be chopped into AC.

In addition to input variations that must be regulated out, the apparatus for such power conversion usually introduces additional inaccuracies to their output voltages, and usually adds noise related to a chopping or to a mains frequency. This noise usually has fundamental, lower harmonic, and sub-harmonic components usually called "ripple," and higher harmonic components related to the edge-rate of chopping that cause Electro Magnetic Interference, or EMI.

Regulators are also usually required to maintain their outputs constant despite changes of their loads. For such applications as Voltage Regulation Modules, or VRM's, for computers, regulators may be required to respond to both desired output voltage changes and to load changes from near-no-load to near-full-load in microseconds.

Traditionally, large output filter capacitors have absorbed sudden load changes and filtered out ripple, and fairly simple feedback loops have been used to control regulator output voltage or current, and impedance at low frequencies, but large-value capacitors are physically-large, expensive, and resist nimble voltage control.

Most traditional control loops have depended upon significant Effective Series Resistance, or ESR, of filter capacitors to allow into their feedback loops a small amount of high-frequency ripple, which has been applied to lead networks to stabilize their control loops.

Beyond the frequencies where practical gain-bandwidths enable active control of output, the minimum amount of ripple on the output of a switching regulator is set by the equation $dV=I*dT/C$, where V is the output voltage in volts, I is the load current in amperes, T is the time in seconds, and C is the filter capacitor in farads. A good regulator would produce only the amount of ripple indicated by that equation.

Unfortunately, ESR related ripple contains two additional ripple components $ESR*Im$ and $ESR*Il$ where, ESR is that of the filter capacitor, Im is the stroke of current that replenishes the energy of the capacitor, and Il is the load current. Unless the complexity of post-filtration is added, both the additional ripple and EMI of $ESR*Im$ ripple pass out of the regulator. Prior art regulators that require ESR for their stability often incur the expense and complexity of additional filtration to abate EMI.

Recently, relatively large monolithic ceramic capacitors with low ESR have become common. Such near-ideal capacitors can, in principle, reduce ripple to the theoretical, reducing post filtration for abatement of EMI up to above their self-resonant frequencies where they appear inductive. However, the practical application of these near-ideal filter capacitors has been troublesome. They form at the regulator output a near-ideal pole that many prior art regulators have difficulty compensating without compromise.

Some earlier regulator designs simply oscillate unless these capacitors are degraded by adding series resistance. Some regulators may be stabilized by an additional pole significantly lower in frequency than the output pole, but with loss of transient response. Some compensation schemes suppress enough of the wrinkles of their Bode plots to achieve some stability together with decent transient response, but the range of inputs and load over which they are absolutely stable is often limited, and outside that range they often produce sub-harmonic ripple tones that make their ripple larger than the theoretical minimum. Some relief has been afforded by the addition of ramp waveforms to regulator control loops. Many of these prior-art solutions lack universality of application, requiring strict application rules to be followed, or the expense of a custom application design to be incurred. One prior-art solution for stabilizing regulators involves adjustment of a "tuning" resistor to the intended application.

It is also common for the stability and transient response of earlier regulators to be predicated upon a fixed, known, and stable filter capacitance. Many modern loads include unknown capacitance, creating an application difficulty for regulators that are capacitance-sensitive, a problem that is exacerbated by the recent practice of "hot-swapping."

The advent of low ESR filter capacitance has engendered another problem that for buck-converters may be as severe as energy-balance problems. The L-C filters of such converters often constitute lumped-element transmission-lines that were in times past substantially terminated by the ESR's of filter capacitors. With low ESR capacitors, resonances and reflections may occur within these transmission-line sections, upsetting loop stability and degrading transient response The problems cited above are occasioned by the prior-art practice of attempting to regulate voltage without addressing the stored energy of regulator components.

BRIEF DESCRIPTION OF THE INVENTION

A power-conversion regulator comprising an inductive reactor, an output filter reactor, and a switch for admitting energy to the inductive reactor, additionally comprises computation circuitry responsive to the flux in the inductive reactor, to a reference signal, to an output voltage, and sometimes to an output load current, for computing the quantity of energy that must be supplied to a load and to the output filter reactor to regulate the output voltage or current to a desired relationship with the reference signal during each chopping waveform cycle driving the switch. As the inductive reactor is charged from an input energy source, the computation circuitry predicts whether the energy in the inductive reactor has become adequate for the regulation. The computation circuitry predicts the energy that is adequate for regulation, and activates the switch for sufficient time adequately to charge the inductive reactor. The computation circuitry may also turn off the switch at a time in a the cycle when insufficient time remains within the cycle for the inductive reactor to deliver to the load and to the output filter reactor capacitor any additional energy with which it might otherwise be charged. The regulator of this invention may also comprise circuitry for determining the value of the inductive reactor. The regulator of this invention may also comprise circuitry for determining the value of capacitance included within the regulator and attached to its output. The regulator of this invention may also comprise circuitry for terminating transmission-line effects of L-C filters.

DETAILED DESCRIPTION OF THE INVENTION

Figure 1A:
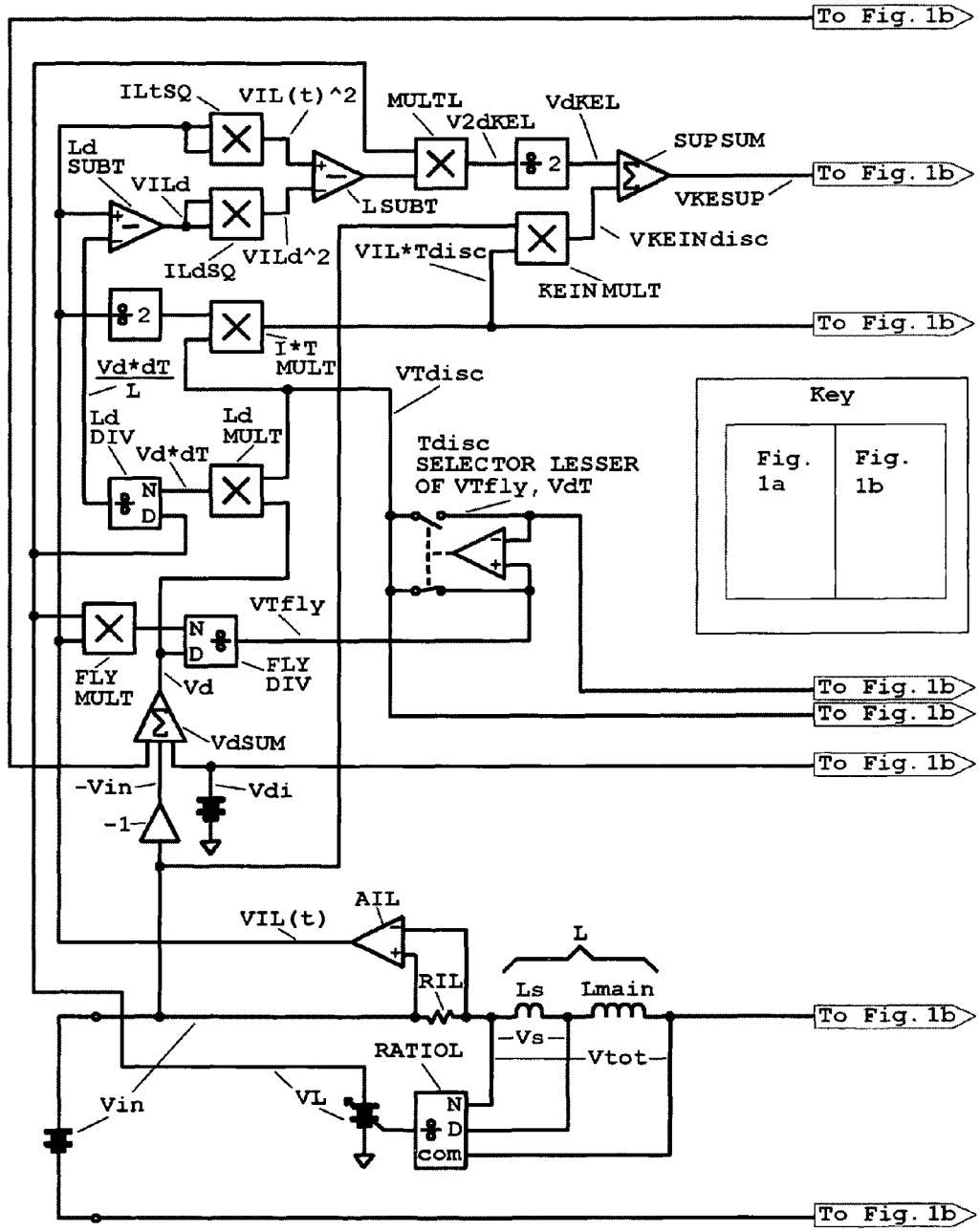
FIGS. 1a and 1b illustrate a flyback-type converter of the present invention.

A power-conversion regulator including an input adapted to receive energy from an energy source, an inductive reactor for energy storage, a switch to charge said inductive reactor with a desired quantity of energy from said energy source, an output filter reactor for output filtration, and an output adapted to supply energy to a load. Said regulator may be used to regulate the output of a DC-to-DC power converter wherein both the energy source and the output voltage or current are substantially steady, or of an AC-to-DC converter wherein the input energy source is already cyclically undulant, and may be embodied either as an integral part of such converters or independently embodied. It should be noted that whilst commencing a chopping cycle by charging the inductive reactor and continuing so to charge it until it holds the predicted required energy incurs minimal prediction time and is simplest to implement, there is an alternate and less preferred method for practicing energy balance according to this invention. This latter method comprises:

predicting energy demand for an ensuing chopping cycle and commencing said chopping cycle, calculating the needed inductive reactor charging time, subtracting the needed inductive reactor charging time from the entire chopping cycle to obtain a time difference, delaying inductive reactor charging from the start of the chopping cycle by said time difference and, terminating inductive reactor charging at the end of the chopping cycle.

It should be understood that, according to this latter method, the time for discharging the inductive reactor follows the commencement of the charging cycle and precedes commencement of an inductive reactor charging time.

If said energy source is substantially DC, the regulator of this invention also comprises an AC signal for chopping. Whether said AC signal is derived from a separate source or from said mains, it will be called a "chopping" signal, and the terms frequency, cycle; and period, will be understood to relate to said aspects of said signal. Said signal may also be used to supply a time variable to computation circuitry described hereinbelow.

It should be understood that all signals of the present invention may be represented by analog or digital quantities, and that all computations may be implemented by analog or digital circuits, or by combinations thereof.

Though many embodiments of this invention illustrated hereinbelow are synchronized by a fixed chopping signal, it should be understood that this invention may be practiced without such rigid clocking, provided that the energy balance, to be more fully discussed hereinbelow, is ascertained and is addressed by said computation circuitry.

Said regulator also receives a reference signal to which said regulator's output is compared to provide a desired output. The invention also may include a circuit to produce a flux signal having a known mathematical relationship with the energy of said inductive reactor's magnetic field, and circuitry to produce an output signal having a known mathematical relationship to the voltage or current at said regulator's output.

Said regulator further includes computation circuitry responsive at least to said flux signal, or a prediction thereof, to said reference signal, and to said output signal, for predicting the quantity of energy that will be required to maintain said output in a desired mathematical relationship with said reference signal at a point during a cycle. An output of said computation circuitry controls said switch to charge said inductive reactor with substantially that quantity of energy required to maintain said regulator output in desired mathematical relationship with said reference signal. Said computation circuitry may be integrated with either or both said flux and output signals, or may be separately embodied.

Said computation circuitry may also comprise turn-around circuitry to terminate charging of said inductive reactor should there occur a condition wherein additional charging of said inductive reactor does not yield additional available energy for regulator output.

Within a cycle, and cycle by cycle, the computation circuitry of the present invention predicts energy required accurately to charge said inductive reactor. Computation and control according to this invention reduces regulator control-loop delay. Reduction of said delay substantially eliminates from said computations of said control-loop an output filter reactor pole that would otherwise limit regulator performance. Substantial elimination of said pole allows the output ripple of the regulator of this invention to be made substantially equal to the theoretical minimum described herein. Substantial elimination of said pole also endows this regulator with excellent transient response whilst simultaneously allowing the use of low ESR capacitors, minimizing sub-harmonic tones, and minimizing post-filtration requirements.

The regulator of this invention may be embodied within various types of converters, some commonly known as "flyback", "buck", "boost", or "sepic", provided that converter operation is predicated upon a substantial fraction of output energy being transferred from input to output through the flux of said inductive reactor. Adaptation of embodiments is accomplished by designing said computation circuitry with algorithms appropriate for the type of converter to be regulated.

The regulator according to this invention may be made to operate in either the "discontinuous" or "continuous" modes well known in the art, or in both, its inductive reactor current either becoming or not becoming, equal to, or less than, zero during each cycle.

The regulator of this invention may be embodied in either single-phase or multi-phase converters, such converters themselves being well known.

The inductive reactor of this invention may be either a simple inductor or a transformer, allowing this invention to be practiced in either or both isolated and non-isolated converters.

To facilitate the use of the actual, rather than nominal, value of said inductive reactor as a variable in the determination of its energy, the regulator of this invention may comprise circuitry for determining actual inductance of said inductive reactor.

Likewise, to facilitate the use of the actual value of capacitance, both contained within and/or attached to its output, as a variable in the determination of its energy, the regulator of this invention may comprise circuitry for determining said actual capacitance.

The regulator of the present invention may be fitted with circuitry to determine the value of its load current.

The regulator of the present invention may be fitted with circuitry to terminate any lumped-element transmission-line formed by L-C filters contained therein or applied thereto.

The regulator of this invention is shown embodied in several types of converters. The regulator of the present invention is applicable to power converters in which a significant fraction of output energy is transported from input to output through the flux of an inductive reactor.

The present invention is practiced when the energy required to supply said load and to replenish said output filter reactor to maintain a desired output voltage or current is calculated and substantially that amount of energy is charged into said inductive reactor, thus maintaining energy balance.

The fundamental equations for energy are:
for the energy in the inductor:

$$KE = (L*I^2)/2 \qquad \text{(Equation 1)}$$

and for the energy in the capacitor:

$$KE = (C*E^2)/2 \qquad \text{(Equation 2)}$$

where:
KE is kinetic energy in joules
E is voltage in volts
I is current in amperes
L is inductance in henries
C is capacitance in farads
And the ^ symbol indicates raised to the power of the following number (here indicating the power of 2).

The more accurately these energies are calculated, the more closely will output ripple approach the theoretical minimum governed by the equation:

$$dV = I*dT/C \qquad \text{(Equation 3)}$$

where:
V is the output voltage in volts
I is the load current in amperes
dT is the time in seconds between replenishments of filter capacitor energy
C is the filter capacitor in farads
dV being output ripple voltage.

A very good regulator would produce only the amount of ripple indicated by equation 3. Slight inaccuracies of energy calculation in embodiments of the present invention give rise to minuscule variations of ripple that occur at half the chopping frequency, i.e. its Nyquist frequency.

Predicting said required energy is the task of signal conditioning and computation circuitry. A reference signal provides a goal in accordance with which this regulator strives to maintain its output. Output signal sensing presents said computation circuitry with a useable representation of said output. The computation circuitry predicts how much energy within a cycle will be required to maintain regulation.

Not only must said computation circuitry monitor energy demand, but also it must monitor or predict stored energy. Since at least part of the stored energy resides in the field, circuitry for providing a signal responsive to the magnetic flux of the inductive circuitry reactor is included. Three ways to practice flux determination according present invention are:

1. determination of the energy contained in said inductive reactor's magnetic field by measurement of that field. Hall-effect and GMR devices capable of making this measurement are well known or,
2. measurement of the current in a winding of, or magnetically coupled to, said inductive reactor. In this case the inductive reactor acts as its own integrator, drawing a current closely related to the voltage-time product having been applied thereto or,
3. computational determination of the energy contained in said inductive reactor's magnetic field by integration of the voltage-time product applied thereto.

These methods are exemplary and other methods for determining flux are also within the scope of this invention.

To accurately predict energy demand and supply, the computation circuitry may also address a time variable. For instance, because time within a cycle elapses as said inductor is being charged, and it is impractical to discharge it forever, a finite time remains to discharge and obtain energy from said inductive reactor. If the value of said inductive reactor be L, the voltage into which said inductive reactor must be discharged be Ed, the time available to discharge be dT, then the amount of current by which said inductive reactor may be discharged, dIL, is governed by the equation:

$$dIL=Ed*dT/L \quad \text{(Equation 4)}$$

If an instantaneous current in said inductive reactor be IL(t), then the current after discharge, IL(d,) for the available time will be:

$$IL(d)=IL(t)-dIL \quad \text{(Equation 5)}$$

Applying equation 1, to both IL(t) and IL(d) and subtracting the latter result from the former result predicts the energy that said inductive reactor will yield by the end of discharge within the cycle.

Since, in asynchronous embodiments of this invention, the inductive reactor may be discharged for as long as desired to return it to a desired current, the inductive energy in such an embodiment may be simpler, and need not be time-related.

The prediction of energy required by, or supplied by, said filter capacitor is simpler, and is based upon the sum of regulator internal capacitance and load capacitance externally connected thereto. If C be said capacitive sum, Eref be a desired output voltage at a point in a cycle, and Eo(t) be an instantaneous output voltage, applying equation 2 to both voltages and subtracting the latter result from the former result predicts the energy that this capacitance will yield or absorb.

A third energy term predicts the energy that will be required by the load during time being predicted, which is simply the product of present output voltage, present output current, and time remaining in the present cycle This term may not be explicitly addressed in asynchronous embodiments of this invention.

In flyback converters, the time between prediction and attaining the desired point is often so short that this term may be ignored or replaced by a factor applied to one of the other energy terms. In the figures below, embodiments of this invention both explicitly addressing, and ignoring this term are shown. Inasmuch as it is usually undesirable to insert a sampling resistor in series with regulator output, load current in a buck regulator passes through said inductive reactor, and the current in said inductive reactor may be measured to determine its energy, load current information may be extracted from said inductive reactor's current data. Such extraction may performed by the computation circuitry described herein below or may be separately embodied.

In addition to the aforementioned signals, said computation circuitry may need to determine the values of said inductive reactor and the aforementioned capacitive sum. If these values are known, they may be presented to said computation circuitry as constants.

Because real inductors may vary from their nominal values and may vary with current and temperature, it is advantageous to include in the regulator of this invention circuitry for determining actual inductance of said inductive reactor. This determination may be embodied explicitly and ratiometrically by using a reference inductor sharing either voltage or current with said inductive reactor, or may be embodied implicitly within said computation circuitry, or by adjunct computation circuitry, by solving the equation L=E*dT/dI where: L=the inductance being determined, E=the voltage across said reactor during the determination time, dT=the determination time, and dI=the change of current in said reactor during said determination time.

To compute an energy term, to be described below, of a flyback regulator, and/or to facilitate implicit determination of inductance as described above, it is often necessary to make regulator input voltage at least part of said "E". To this end, the regulator of this invention may also comprise input voltage measuring circuitry.

Likewise, not only do real capacitors vary from their nominal values and vary with voltage, but a typical load may include significant capacitance that should be included in the energy computation of the regulator of this invention. Moreover, the recent prevalence of "hot-swapping" may cause load capacitance to vary widely and suddenly. It is therefore advantageous to include in the regulator of this invention circuitry for determining actual capacitance therewithin and attached to the output thereof.

Just as inductive reactor value may be determined either explicitly or implicitly, so may the aforementioned capacitive sum be explicitly or implicitly determined. Explicit capacitance determination may be done ratiometrically by relating either total ripple current or output ripple current to the current in an internal filter capacitor of known value. Implicit capacitance determination is done by exploiting the fact that the capacitive portion of the energy balance of the present invention underlies its voltage regulation. Thus, if a second, slower, control loop be embodied to servo capacitance to that value which results in correct output voltage, the capacitance that it reports will reflect the total capacitance at the regulator output. Not only does this technique simplify capacitance measurement, but it also may yield line and load transient response superior to that obtained using capacitance as reported by a ratiometer.

It should be noted that implicit capacitance determination rests upon accurate inductive reactor value determination. What is actually reported to the energy balance of the computation circuitry is L/C ratio. Inductance determination rests in turn upon accurate knowledge of voltage, current, and time, but the latter are usually easily determined with more than adequate accuracy.

It should further be noted that though this invention is, for clarity, presented in terms of absolute values of such variables as time, voltage, current, inductance, and capacitance, these computations have mathematical equivalents that may be expressed in terms of L/C ratio. Therefore, even though, for thoroughness of explanation, some embodiments of this invention are shown with separately-reporting inductance and capacitance determining circuitry, an adaptive portion of said computing circuitry may operate according to this invention with any adaptive technique that results in control of inductive charging based on substantially accurate energy balance. Such techniques according to this invention may not even explicitly report values of components, as long as energy balance is thereby achieved.

Moreover it should be noted that either diodes or active switches may be used for some switching functions in converters. The voltage drops of such switches may be explicitly calculated and entered into the aforementioned energy balance, but when such losses are small it often suffices to accommodate these slight losses and those of snubber networks by slightly adjusting one of the energy terms that requires explicit computation.

Moreover, it should be noted that though the feedback loop delay of this invention is much reduced below that of prior art, the relationship between control and output is discontinuous for at least very short times, which makes this regulator a sampled system. Like many sampled systems, this regulator may yield its cleanest output with excellent transient response when its loop gain is slightly less than unity. When said loop corrects most of its error within a cycle, its transient error is minuscule compared to its theoretical minimum ripple. Said loop is robust, allowing approximate calculation to be compensated by lower gain.

Said computation circuitry is inutile unless it performs its most important function, which is controlling the charging of said inductive reactor. Limitation of charging may be done under the three circumstances of:
1. attaining predicted energy balance,
2. occurrence of an inductive energy turnaround, as will be later described hereinbelow,
3. mandatory reset to avoid excessive duty cycle that might endanger the regulator or allow ripple at an undesirably low frequency and may also be done if in the event of an under-or-over-voltage or over-current condition.

Charging is stopped by turning off the aforementioned switch under control of said computation circuitry. Said switch may be a semiconductor such as a BJT, a MOSFET, and IGBT, or a thyristor with needed commutation apparatus, Said switch may also be embodied as a saturable reactor such as is well known, to which magnetic bias may be applied either suddenly or gradually, and which may even be integral with said inductive reactor.

Additionally, circuitry is provided to avoid charging said inductive reactor with energy that cannot be quickly transferred to said regulator output. Early in a cycle, as charging of said inductive reactor begins, charging for additional time makes additional energy available therefrom later in that cycle. However, because without infinite voltage the current in an inductive reactor cannot be changed instantaneously, a turn-around point may be reached later in a cycle when insufficient time remains to extract increased energy from said inductive reactor. Charging beyond that point in time reduces available energy within that cycle. This concern may be ignored in asynchronous embodiments of the present invention. For this purpose, stating that there is no longer energy available is not meant to imply to that there is no longer energy stored in the inductor, but that there is insufficient time remaining in the cycle to discharge any additional energy being placed into the inductor.

Equations 4 and 5 show that as discharge time of said inductive reactor approaches zero, the current change that may be caused therein, and the energy that may be extracted therefrom also approach zero. At some point in any cycle, as inductive energy increases whilst the time to extract same decreases, said turn-around point may be reached.

Said turn-around circuitry is responsive, either directly or indirectly, to a sign-change of the slope of the change of available kinetic energy in said inductive reactor, as determined by equations 1, 4, and 5. Direct response is made by computation from those equations, whilst indirect response is made by computation based on the sign-change of the slope of energy-balance.

Implementation of a control loop that assumes that additional charging produces additional available energy may result in negative feedback and stable operation up to said turn-around point but, using such a loop, charging beyond said amount of energy yields positive feedback that may cause a regulator destructively to run away. Therefore the computation circuitry of the regulator of this invention may comprise turn-around circuitry to terminate charging of said inductive reactor should such a turn-around condition occur.

Said turn-around circuitry may be independently embodied within prior art regulators to prevent runaway. An aspect of the present invention is practiced when charging of said inductive reactor is terminated to avoid available-energy turn-around.

Turn-around prevention may be omitted from asynchronous embodiments of the present invention.

The regulator of this invention may be implemented with a capacitively coupled lumped-element transmission-line terminator to minimize lumped-element resonance and transmission-line reflections. A termination according to this invention may comprise an extra capacitor in shunt with normal filter capacitor or capacitors, its own ESR having been selected substantially to match the transmission-line impedance according to the equation $Zo=(L/C)^{1/2}$, Said termination may alternatively comprise said extra capacitor in series with a discrete resistor, non-linear resistive elements such as diodes or varistors, or an active terminator comprising active devices such a BJT's or FET's. The output terminal of a properly biased totem-pole output stage, well known in semiconductor amplifiers, can also act as a non-linear terminating resistor according to this invention. Alternatively, since the energy-balance equations of this invention address the energy of the transmission line formed by said inductive reactor and internal and external filter capacitance, an explicit terminator may be omitted, allowing the computation circuitry to effect the task of termination.

As may be seen from the above, and in the description of the various embodiments below, the basic process of this invention involves energy balancing, or more specifically, the charging of the inductive reactor so that the amount of energy placed into the inductive reactor during inductive reactor charging is based approximately upon a per-chopping-cycle load energy requirement. The "requirement" may be based upon actual energy use, energy use during a previous cycle, predicted use for the remainder of the cycle, or predicted use for a future cycle. The term "based approximately upon a per chopping-cycle load energy requirement" may mean several things including: 1) based upon an estimate of the energy required by the output load, 2) based upon an estimate of the energy required by the output load and the output filtration reactor. (The output filtration reactor will usually be a capacitor for voltage supply/regulator and a inductor for a current supply/regulator.)

As used herein, a "chopping cycle" is either the clocked period of a synchronous converter, or a non-coherent period which responsively occurs in the natural operation of a non-synchronous converter.

Figure 1B:
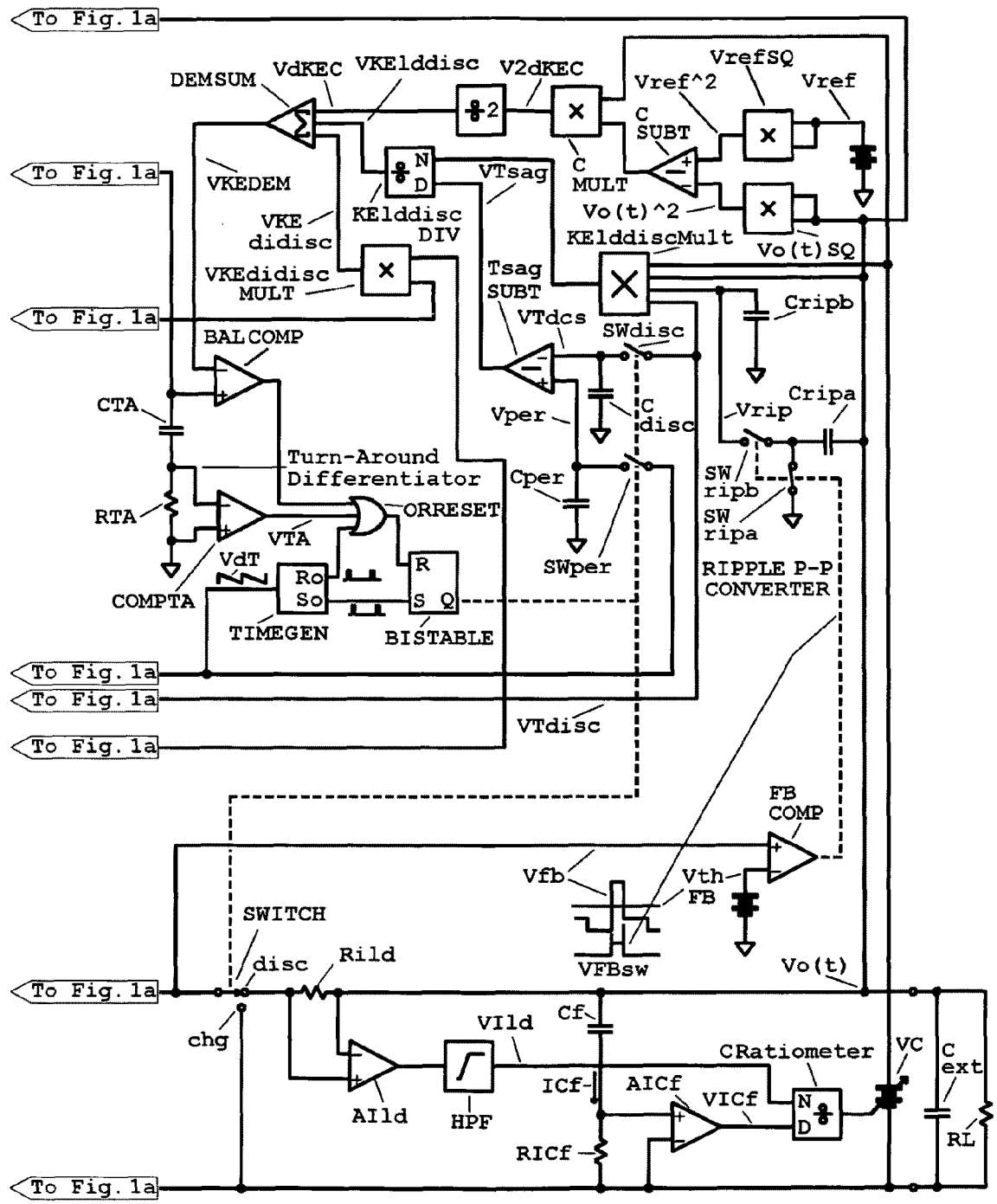

FIG. 1 illustrates a flyback-type converter comprising a synchronous regulator of the present invention, which operates as follows:

As in prior-art flyback regulators, one pole of an inductive reactor (L) is connected through sampling resistor RIL to one terminal of an input voltage source (Vin). A switch cyclically and alternately connects a remaining pole of said inductive reactance to a remaining pole of said voltage source and through sampling resistor RIld to an output filtration capacitance and a load, which are in turn returned to said input voltage source. The duty-cycle of this switching relates an output voltage minus said input voltage to said input voltage.

At this point we begin to depart from prior-art regulation techniques. Whilst an inductor L, comprising the sum of Lmain and Ls is connected between the poles of said voltage source Vin, its current, IL, rises. As IL rises, so does the kinetic energy contained in the inductive field. IL, passing through RIL drops a voltage proportional thereto. Amplifier AIL generates a voltage signal VIL(t) that represents the instantaneous value of IL.

Now we sharply depart from the prior art. VIL(t) is applied to both inputs of multiplier ILtSQ, which generates a signal VIL(t)^2 that represents the square of the instantaneous value of IL.

Since it usually is not practical or desirable to operate a flyback converter at a low frequency, there may be a limit set on the period of the cyclic switching of the regulator. To begin charging the inductor as just cited, a timing generator TIMEGEN sets a flip-flop BISTABLE which in turn connects said inductor L across Vin. At the same time, the timing generator issues a descending ramp waveform, VdT, that represents the time remaining in the present chopping cycle.

Since infinite time is not available to discharge the inductor L, and neither is infinite voltage available to discharge it in infinitesimal time, it may become impossible to extract all of the energy in its field in a given cycle. The remaining cycle time may cause the discharged value of IL, ILd, to be greater than zero current.

Since, upon switching to a discharging state, the inductor L will be connected between any voltage at the regulator output and the positive terminal of Vin, the dominating voltage across the inductor during discharge Vd will be the output voltage Vo(t), plus any drop, Vdi, across SWITCH in its "disc" position, minus VIN (−VIN). Summer VdSUM processes said three quantities to produce a discharge voltage signal, Vd. If a synchronous rectifier is used for the "disc" pole of SWITCH, the term Vdi will likely be negligible, but if a diode is used Vdi may be important. In the latter case, a fixed value may represent diode drop, a lookup table may return a Vdi based on load current, or a similar diode driven by a load-related current may be used to produce Vdi.

Inductor L will be discharged from its present current IL(t) to ILd according to the equation ILd=IL(t)−V(d)*Tdisc/L).

Inductor L may discharge to zero current by the end of the present chopping cycle. If L is predicted fully to discharge, the quantity to be used for Tdisc is the flyback time Tfb. To produce a signal representing Tfb, VTfly, VIL, and a voltage representing inductance, VL, are applied to multiplier FLYMULT. Divider FLYDIV divides the output of FLYMULT by Vd to produce a signal VTfly in accordance with the equation dT=L*dI/E.

Said signal VL represents the value of the summed inductance of Lmain and Ls. Ls is an auxiliary inductor that comprises a standard for the ratiometric measurement of Lmain. If the value of Lmain is adequately known and stable, Ls may be omitted along with inductance meter ratiometer RATIOL, and a constant signal VL may represent L in the calculations according to this invention.

If VTfly exceeds VdT, insufficient time remains within the present cycle fully to discharge inductor L, in which case VTF is not the appropriate signal to use to predict the discharge of L. In this latter case, VdT is the appropriate signal to use to predict the discharge of inductor L.

A Tdisc selector selects the lesser of VTfly or VdT to produce a discharge time signal, VTdisc, representing discharge time.

To obtain a signal VILd predicting the current in L at the end of the present cycle, V(d) and VTdisc are applied to the inputs of inductor discharge multiplier LdMULT. Inductor discharge divider LdDIV divides the output of LdMULT by VL to produce a signal predicting the change of current in L were discharge to commence immediately and continue until the end of the selected discharge time. Subtractor LdSUBT subtracts the latter signal from VIL(t) to produce a signal VILd predicting the current in L were discharge to commence immediately and continue until the end of the selected discharge time.

VILd is applied to both inputs of multiplier ILdSQ which generates a signal VILd^2 that represents the square of the predicted discharged value of IL.

Subtractor LSUBT generates a signal representing the difference of VIL(t)^2 and VILd^2 which is applied to one input of multiplier MULTL. VL is applied to the other input thereof, to yield a product, V2dKEL, which, when divided by 2, becomes a signal VdKEL, representing the kinetic energy predicted to be available from inductor L were inductive discharge to commence immediately and continue until the end of the selected discharge time.

As L discharges, IL passes through VIN, through L and into both a load RL and into an internal filter capacitor Cf and any external capacitance Cext associate with RL. Thus, during discharge time, VIN is in series with the voltage generated by the flyback of L, and thus VIN contributes energy to the output. This energy is the product of VIN, the average current in L during discharge, and the time of discharge. Alternatively, load current and the period of the present cycle may replace the two latter terms to practice this invention. To generate a signal VKEINdisc predicting said energy from VIN, VIL(t) is multiplied by VTdisc by multiplier I*TMULT, and resulting product is then multiplied by VIN in multiplier KEINMULT. The output of I*TMULT is also passed to multiplier VKEdidiscMULT.

Summer SUPSUM adds VdKEL and VKEINdisc to predict the supply of energy were inductive discharge to commence immediately and continue until the end of the selected discharge time, producing an energy supply signal, VKESUP.

Vo(t) has some instantaneous value that may be above, below, or equal to correspondence with a desired voltage, Vref, and an object of the present invention is to cause Vo(t) to correspond with said desired voltage at some time in the switching cycle. This arbitrarily chosen time is at the end of the cycle after the inductor has been charged and discharged.

To this end it is desirable to predict how much energy the capacitance will require to be charged to a desired voltage were inductive discharge to commence immediately and continue until the end of the selected discharge time.

To this end, Vo(t) is applied to both inputs of multiplier VOtSQ to generate a signal Vo(t)^2 representing the square thereof. Vref is likewise applied to both inputs of multiplier VrefSQ to generate a signal Vref^2 representing the square thereof.

Subtractor CSUBT generates a signal representing the difference of Vo(t)^2 and Vref^2 which is applied to one input of multiplier CMULT. A signal VC, representing the sum of regulator internal capacitance plus any external capacitance is applied to the other input thereof, to yield a product V2dKEC, which when divided by 2 becomes a signal VdKEC, representing the kinetic energy predicted to be required to charge total capacitance to said desired voltage were inductive discharge to commence immediately and continue until the end of the selected discharge time.

If the value of Cf and any additional capacitance applied to the terminals of the regulator of this invention is adequately known and stable, a constant signal VC may represent C in the calculations according to this invention. If not, circuitry for determining that total capacitance will be discussed hereinbelow.

If a diode is used for discharging inductor L, a loss will be incurred that consumes energy. A signal VKEdidisc predicting this lost energy, were inductive discharge to commence immediately and continue until the end of the selected discharge time, is produced by multiplier VKEdidiscMULT. Where a synchronous rectifier is employed rather than a diode, the signal VKEdidisc, and the apparatus that produces it, may be omitted to practice the present invention.

During discharge, as VIN and L are contributing energy, any load on the regulator output is simultaneously consuming energy. This load energy is predicted by the equation:

$$KEl d disc = Vo(t) * Iload * Tdisc \quad \text{(Equation 6)}$$

where: Iload=load current.

If the load is substantially resistive, one may choose to obtain VIload a signal representing Iload, from a sampling resistor in series with the regulator output, along with suitable amplification, and thus practice the present invention. To address the likely situation wherein the load is reactive or that it is undesirable to apply a sampling resistor, circuitry for implicitly determining load current will be discussed hereinbelow.

Load current may be determined according to the equation $$Ild = Ctot * Vrip / Tsag \quad \text{(Equation 7)}$$

where:
Ild=load current
Ctot=total capacitance at the regulator output
Vrip=peak-to-peak output ripple voltage
Tsag=time of the cycle minus the discharge time of L
Combining the two equations above:

$$KEl d disc = Vo(t) * Tdisc * Ctot * Vrip / Tsag \quad \text{(Equation 8)}$$

Ripple P-P CONVERTER of conventional structure, comprising SWripa, SWripb, Cripa, and Cripb converts Vo(t) to provide Vrip. This converter is driven by a signal VFBsw which is generated by a conventional comparator, FBCOMP, when Vfb, the flyback voltage of L exceeds a predetermined threshold voltage, VthFB.

To generate VKElddisc, a signal predicting the aforementioned energy to be consumed during discharge time, VC, Vo(t), Vrip, and VTdisc are applied to multiplier KElddiscMULT, the output of which is applied to divider KElddiscDIV, the quotient thereof being the signal VKElddisc.

Just as summer SUPSUM predicts the supply of energy, in like manner summer DEMSUM adds VdKEC, VKElddisc, and VKEdidisc to predict the demand for energy were inductive discharge to commence immediately and continue until the end of the selected discharge time, producing an energy demand signal, VKEDEM.

Balance comparator BALCOMP compares said predicted energy supply signal, VKESUP, with said predicted energy demand signal, VKEDEM. When the former exceeds the latter, BALCOMP generates a logical 1 at the input of OR gate ORRESET, which in turn resets BISTABLE, which in turn switches SWITCH to commence the discharge of inductor L.

In principle, there exists another energy loss term that is not explicitly addressed in this embodiment, that being the energy dissipated by any resistor of any snubber network that may be associated with inductor L. In practice, this energy has been found to be so small as not to merit explicit attention, and thus it exists as an insubstantial error in the aforementioned energy terms that are explicitly addressed.

TIMEGEN will set BISTABLE anew to begin a new cycle at the end of the present cycle. If flyback time equals or exceeds the remaining time of the present cycle, this will occur upon completion of the predicted and chosen discharge time. If however, flyback time is less than the remainder of the present time, the inductor L will conduct substantially zero current until charging commences in a new cycle.

Were energy balance the only reset term of the regulator of this invention, this regulator would share with prior-art regulators a propensity for destructive runaway. The root of this propensity is the fact that an inductor cannot instantaneously be discharged without infinite voltage or infinite time. At the commencement of inductive charge, additional charging time increases available inductive energy. However, if one persists in time to charge the inductor until the voltage-time product available for its discharge becomes insufficient to discharge it, its available energy begins to decrease with increased charging time. The energy from VIN during discharge time is also limited by discharge time. In this figure illustrating the present invention, the energy supply signal, VKESUP, is also fed to a slope detector comprising differentiator CTA and RTA along with comparator TACOMP. When the slope of VKESUP versus time reverses, or "turns-around", a signal VTA from COMPTA is applied to ORRESET, which in turn resets BISTABLE, which in turn switches SWITCH, terminating the inductor charging cycle. The turnaround aspect of the present invention contrasts with prior art in which a certain slope of feedback must prevail lest positive feedback incur destruction of the regulator. Prior art usually avoids turnaround by arbitrary limitation of duty-cycle or averts destruction by limiting overall current draw should turnaround occur, both of which approaches can incur undesirable inefficiency of operation. The turnaround aspect of this invention may be practiced using turnaround responsive either to VKESUP or VdKEL.

A method of generating VL as a function of inductance follows. Lmain and Ls together comprise a total inductance, L. Whilst the value of Lmain may be modulated by nonlinearities of the B-H curve of its core, Ls may be chosen to have smaller inductance than Lmain, perhaps 1% or 10% thereof, and thus it may drop but a small AC voltage. If Ls be suitably chosen, it will preferably remain in a linear portion of its own B-H curve at the current where Lmain is approaching saturation. Ls may also be chosen to be as accurate as desired. Since Il flows through both Lmain and Ls, a AC voltage Vtot is dropped across their series combination whilst a smaller voltage Vs is dropped across Ls. The ratio of Vtot to Vs, provided by divider LRATIOMETER, suitably scaled, provides a source of VL responsive to the actual value of Lmain plus Ls which may be used both for energy calculations according to this invention and to warn that Lmain is either inadvertently of wrong value or is approaching saturation. Inductance may be determined by ratiometry using voltage ratios of series-connected inductors as shown, using current ratios of parallel-connected inductors or by implicit determination from volt-time product divided by current change as is shown in another figure of this invention. Whilst ratiometric determination of inductance is well-known, its application to energy calculation of energy in the control loop of a switching regulator is an aspect of this invention illustrated in this figure. Other circuitry for generating VL are shown in more detail hereinbelow in subsequent figures.

Any of the embodiments described throughout this disclosure may need to determine Il, the current in the inductive reactor, in order to determine the value of the inductor reactor or the flux stored therein. One method of so doing may be to employ a current mirror. Current mirrors are well known in the art, including the use of commercially available devices such as SENSFETs, HEXSENS, or mirrorFETs. Any other method of sensing current, whether now known or hereinafter invented is meant to be within the scope of the invention. Similar techniques and methods to any of those described herein may be used to determine other currents within the embodied circuits including current in the load or in the output filter capacitor.

A method of generating VC as a function of capacitance follows. The capacitance capable of storing energy for prediction according to the present invention comprises internal regulator filter capacitance plus any capacitance connected to the regulator output terminals. The switching cycle causes the AC current portion of IL which is divided between internal and external capacitance according to their respective susceptances. In this figure, the discharge current of L passing through a sampling resistor RIld, drops a voltage which, amplified by AIld and passing though high-pass filter HPF produces a signal VIld, which represents the AC portion of the load and filter currents, i.e., all the current flowing in the total output capacitance. The current if Cf passing through sampling resistor RICf drops a voltage that is amplified by amplifier AlCf to provide a signal VICf, which is in turn applied to the divisor input of divider CRATIOMETER. Thus, by ratiometry, the AC portion of IL divided by the current in Cf, if Cf be accurately known, and the ratiometric output be suitably scaled, provides a source of VC responsive to the actual value of C, which voltage may be used for energy calculations according to this invention. Suitable dividend and divisor may be obtained using sampling resistors, amplifiers, and filters, as shown in this figure or by using current transformers as shown below in detail in another figure. Whilst ratiometric determination of capacitance is well-known, its application to energy calculation of energy in the control loop of a switching regulator is an aspect of this invention illustrated in this figure. Other circuitry for generating VC are shown in more detail hereinbelow in subsequent figures.

The reset signal of TIMEGEN may not always be vital to proper operation, but may be useful when the frequency of regulator output must be known, for example when synchronous operation of several regulators is desired.

In this embodiment, the computational functions shown are performed using well-known analog techniques. Addition and subtraction may be performed using some of thousands of species of well-known operational amplifiers. Multiplication and division may be performed using Gilbert-cell devices such as the Analog Devices AD734 multiplier/divider. Multiplication and division may also be performed using well-known techniques exploiting the predictable logarithmic I/V behavior of BJT's. Alternatively, well known pulse-width modulation techniques may be used to perform the slower multiply/divide functions of this embodiment such as calculation of inductance and capacitance. All of these techniques may be implemented using a wide range of degrees of monolithic integration, from discrete components to monolithic integrated circuits. It is best to use fast techniques for calculation of energy terms in the computational paths responsive to VIL and Vo(t), inasmuch as delay generates energy-balance error. In the calculation of the energy terms of this synchronous embodiment of this invention "time is of the essence." Likewise, if excellent load transient response is desired, fast techniques are needed for predicting the load energy term of this embodiment.

Figure 2:
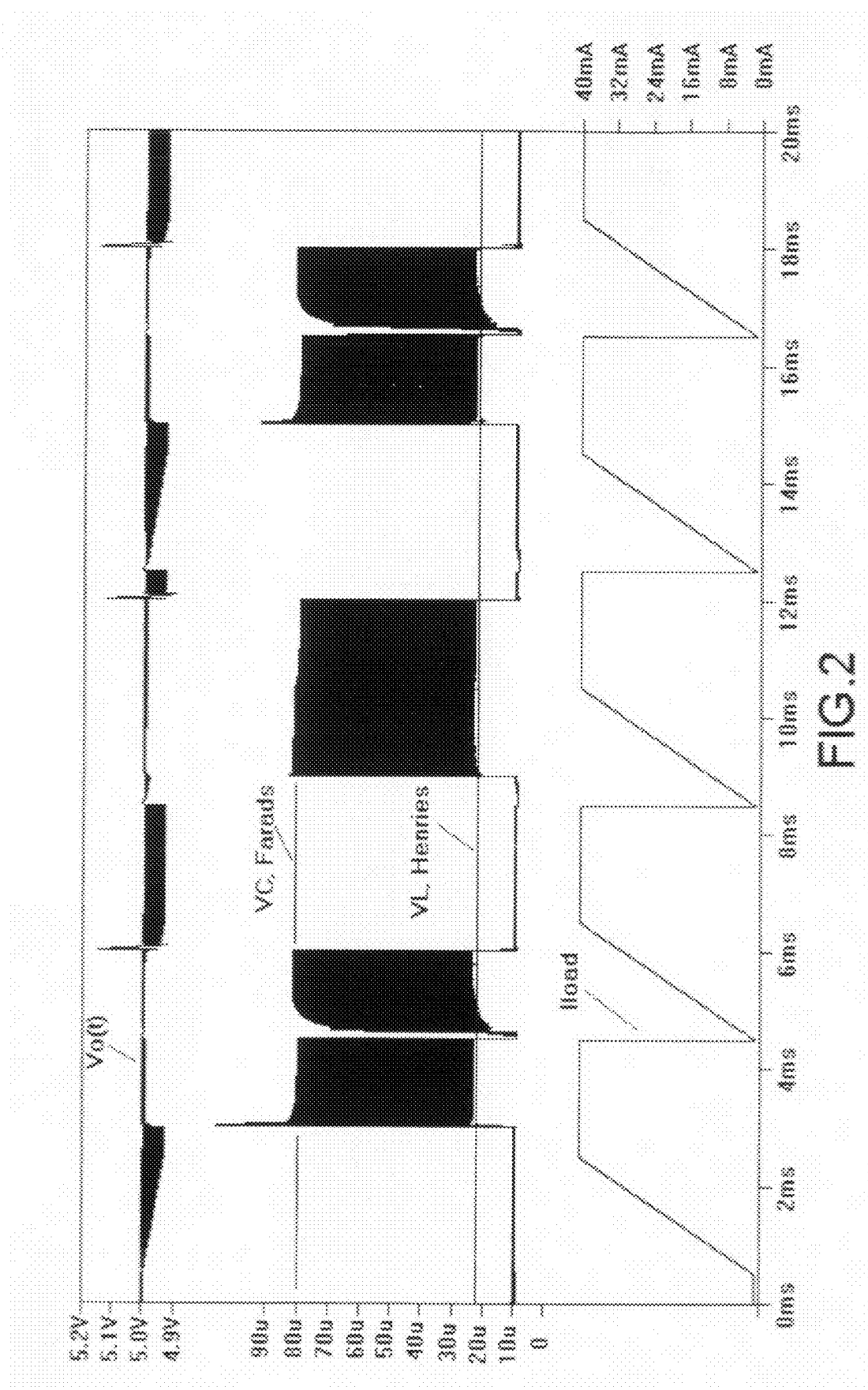
FIG. 2 shows waveforms of the regulator of FIG. 1 being exercised with load and capacitance changes at its output terminals.

FIG. 2 shows waveforms of the regulator of FIG. 1 when it is exercised with a ramp load change between about 1 mA and 40 mA, and by a switched capacitance of 70 μF at its output terminals, causing, with its internal 10 μF capacitor a total capacitance change between 10 μF and 80 μF. Ripple amplitude of output waveform Vo(t) is substantially inversely proportional to total capacitance. Since the desired voltage, in this case 5V, occurs in this embodiment at the peak of Vo(t) ripple, the top of Vo(T) remains substantially at 5V. The spikes thereupon occur when capacitance drops abruptly leaving, momentarily, an internal report of capacitance far in excess of the new true value. Moving down in the record is shown VC, the output of a capacitance meter comprised by this embodiment of the present invention. Only the peaks of VC are used to report capacitance. Almost hidden below the ripples of VC is shown VL, the output of an inductance meter comprised by this embodiment of the present invention. VL is accurately reporting an internal inductance of 22 μH. The waveform below is a separate report of Iload because, despite the internal existence of a term representing load energy during discharge time, which contains information about load current, there is no explicit term for Iload available in the embodiment.

FIG. 2, as well as all other graphs showing results of the invention, are generated using SPICE, a well known computer simulation tool for electrical circuits.

Figure 3A:
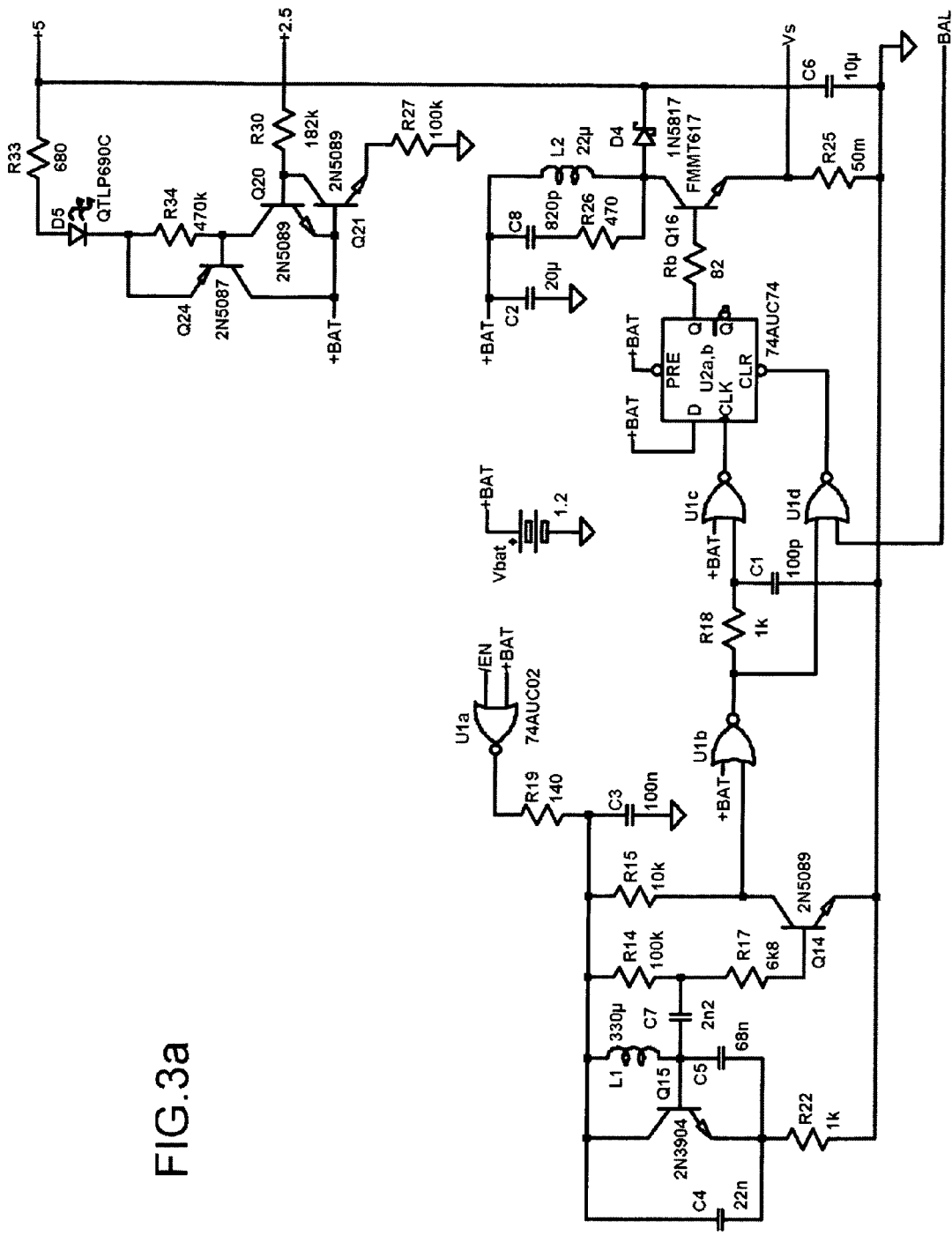
FIG. 3 is a schematic diagram of a simplified flyback converter according the present invention.
Figure 3B:
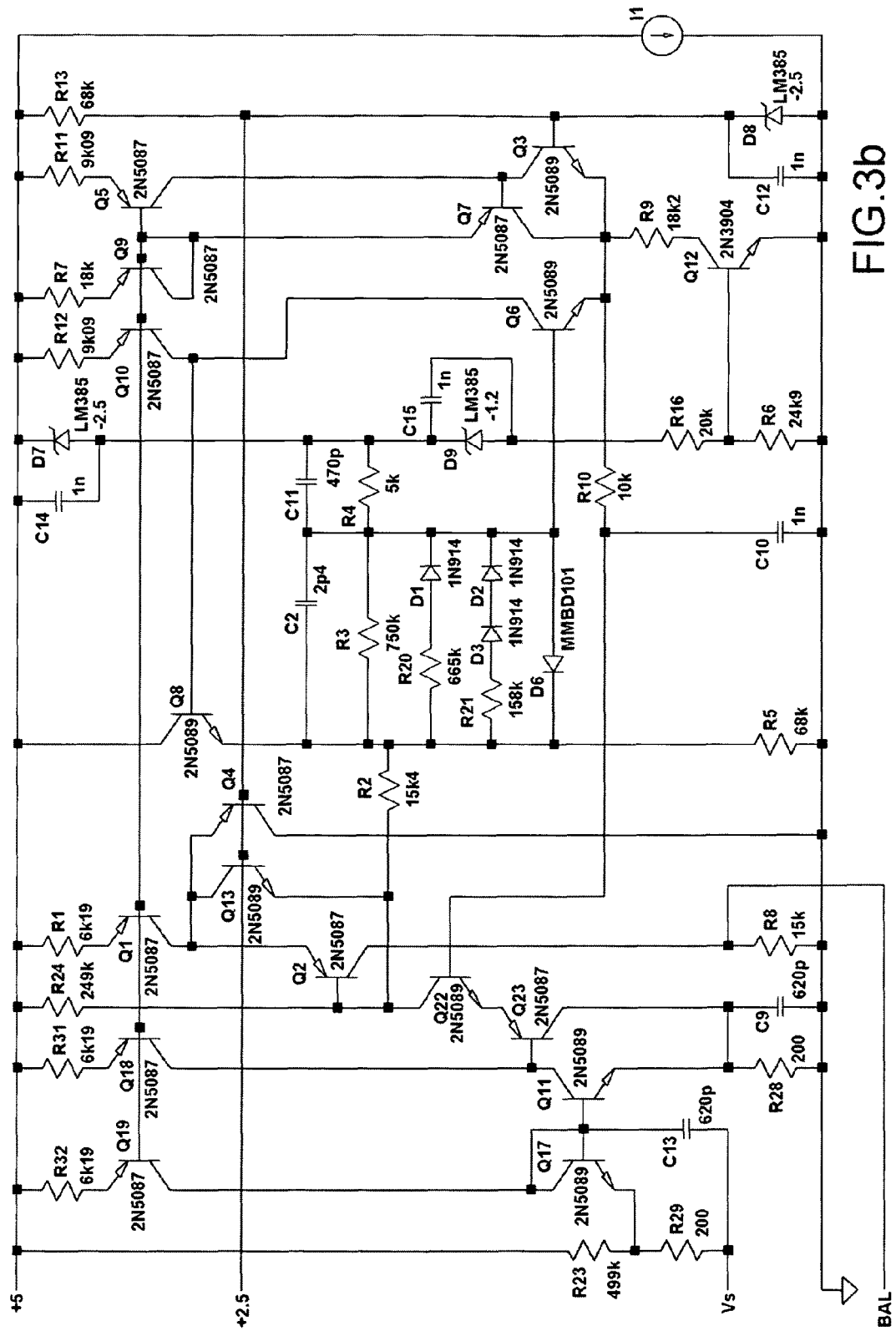

FIG. 3 is both a SPICE and actual tested hardware schematic diagram of a flyback converter employing regulation according to a simplified form the present invention. This converter operates at an input voltage of 1.1 to 1.6 volts from VBat and produces an output of 5V with a power of 100 mW into load Il. L1, Q15, C4, C5, and R22 form an L-C oscillator of conventional character with a frequency of about 67 KHz. The output thereof is AC coupled by capacitor C7 to a sharpening and duty-cycle modifying circuit comprising Q14, R14, R15, and R17, all buffered by U1b to provide a chopping signal. U1a provides for enablement or disablement of the converter. R18, C1, and U1c delay the rising edge of the chopping signal to prevent it from being confounded with and CLeaR signals to bistable U2a,b. To increase output drive, Bistable U2a,b is actually a single bistable made compound, of latches that occur two per package.

As the converter starts up and pumps up its output, the regulator is restrained from operation and the chopping signal passes at full duty cycle through bistable U2a,b. The output thereof drives a conventional flyback converter comprised of Q16, L2, R26, C8, and D4, the latter replenishing filter capacitor C6. C2 is a reservoir capacitor to supply local energy to the flyback converter and to provide a short AC return between L2 and ground. It should be noted that D4 may be replaced by a well-known synchronous rectifier to practice this invention. R25, Q17, Q23, Q11, Q19, Q18, Q22, R32, R31, R29, R28, C13, C9, R23, R24, R10 and C10 form a current monitor with a current sink output that is a replica of the current in Q16, and of L2 during inductor charge. Q3, Q6, Q5, Q7, Q9, Q10, Q8, and Q12, along with resistors R5, R9, R11, R12, R7, and form a voltage amplifier. D7 level shifts the 5V output to 2.5V with ripple superimposed. D8 is a 2.5-volt reference which is fed to the non-inverting input of the amplifier at the base of Q3. The shifted ripple on the − (that is, the negative) end of V4 is fed though input resistor R4 and speedup capacitor C11 to the base of Q6 which is the inverting input of the same amplifier. D6 prevents excess negative excursions of the amplifier output. R3, R20, R21, D1, D2, and D3 form a curve-fitting feedback network to bend the replica of the ripple to an approximately square-root function. C2 adjusts the transient response of the amplifier. Since the amplifier is inverting, and referred to 2.5 volts, its output is a positive-going bent sawtooth wave representing in the positive direction the square-root of the negative going output ripple below 5 volts. The replica of inductor current sunk by Q22 develops a negative going voltage drop across R2. When that drop suffices bring the base of Q2 below 2.5 volts, the comparator comprising Q1, Q2, Q4, and R1 sources current to R8, producing a voltage which, passing through nor gate U1d, resets the bistable. U2a,b, turning off Q16, thus terminating the charging of L2 and initiating the transfer of its energy to C6. Q13 clamps negative excursions at its emitter. Q20, Q21, and Q24, R27, R30, R33, and R34 illuminate LED D5 when the battery voltage falls below 1.1 volts, to indicate the need to replace the battery.

Figure 4:
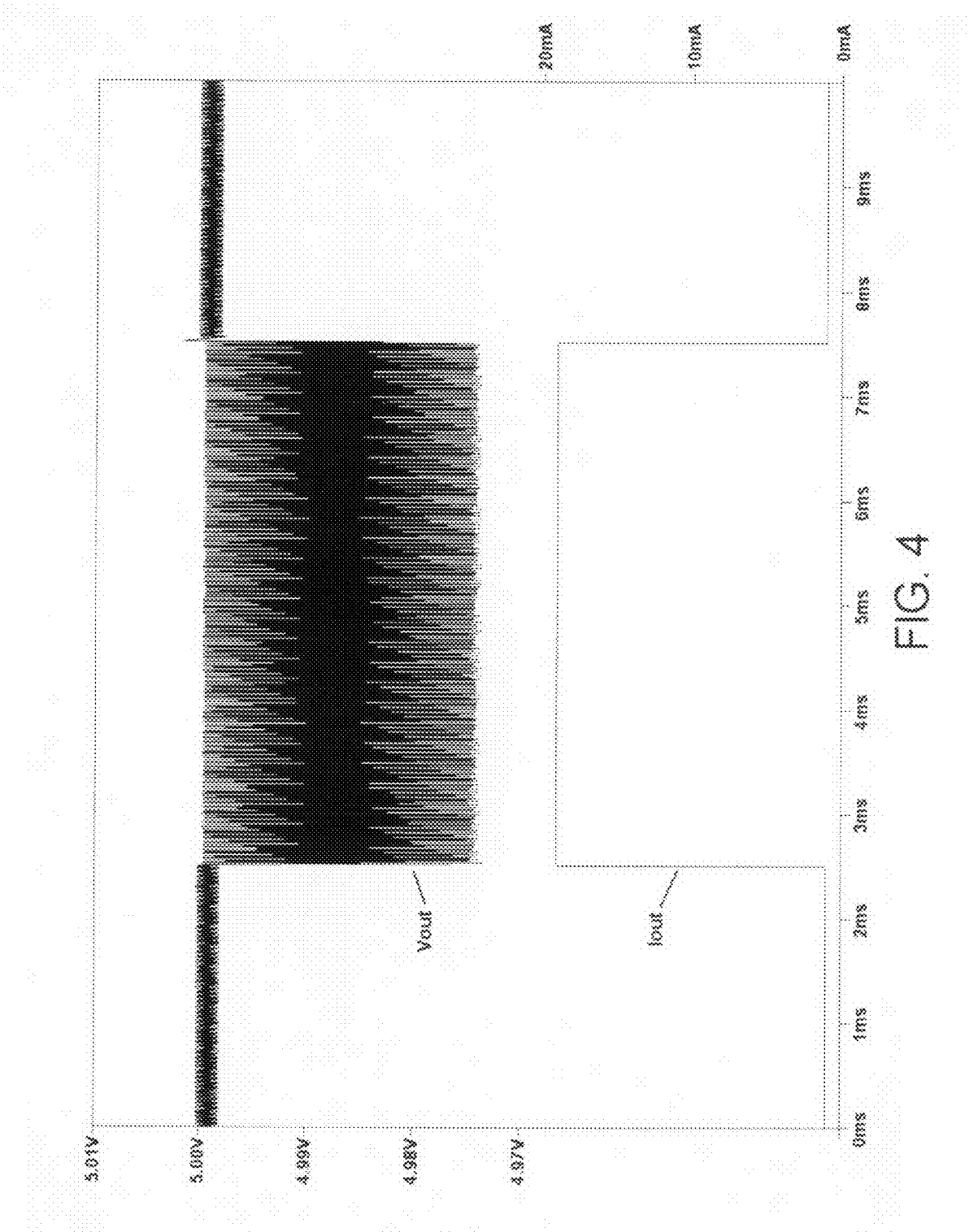
FIG. 4 shows the transient response of the regulator of FIG. 3 when its load is abruptly exercised.

FIG. 4 shows the transient response of the converter and regulator of FIG. 3 when its load is abruptly changed from 1 mA to 19 mA, and back to 1 mA.

Figure 5:
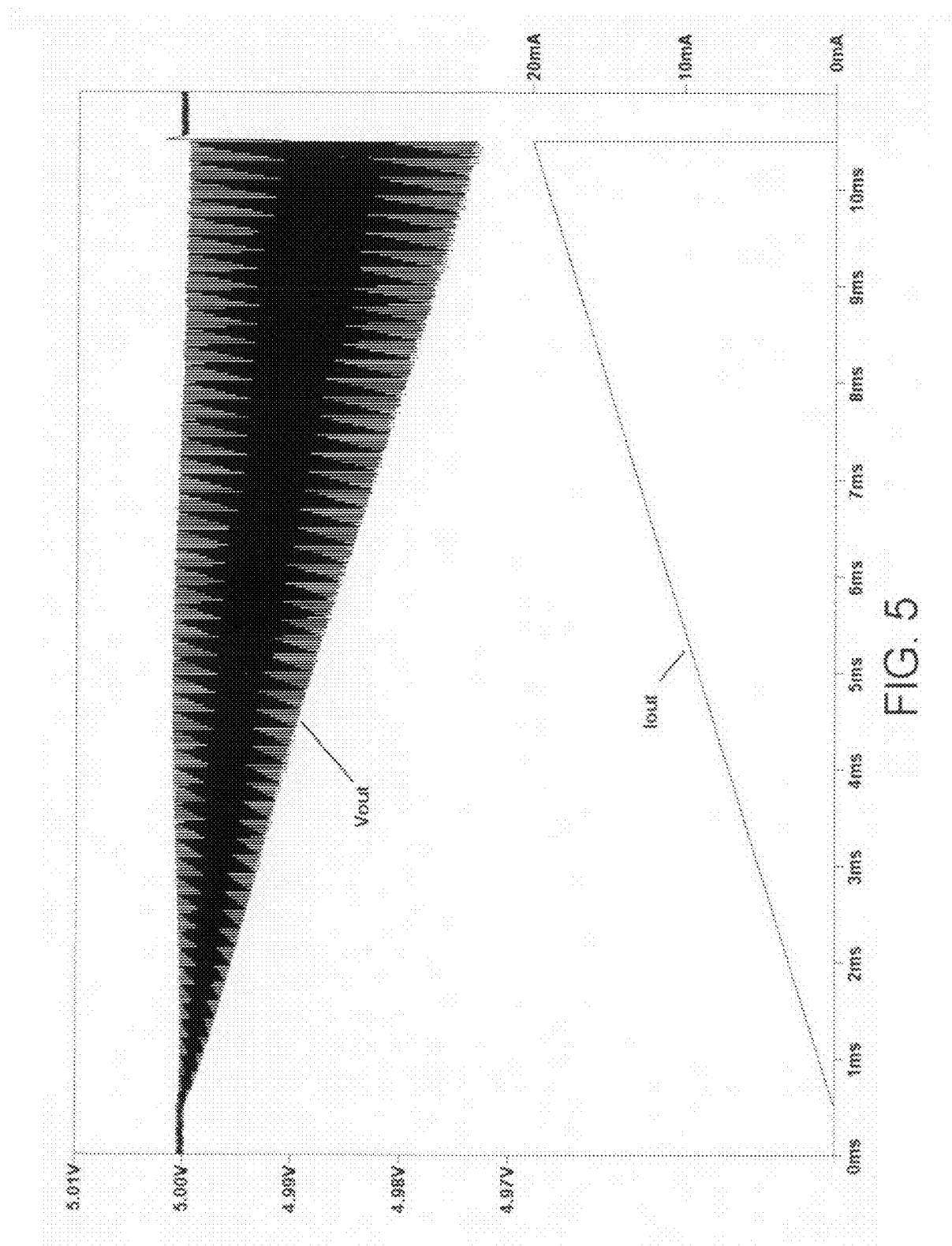
FIG. 5 shows the ripple of the regulator of FIG. 3 whilst its load is gradually exercised.

FIG. 5 shows the ripple of the converter and regulator of FIG. 3 whilst its load is ramped from 0 mA to 20 mA. At full load, the theoretically minimum ripple is 27.2 mV and the ripple of the circuit of FIG. 2 is 27.4 mV.

Figure 6:
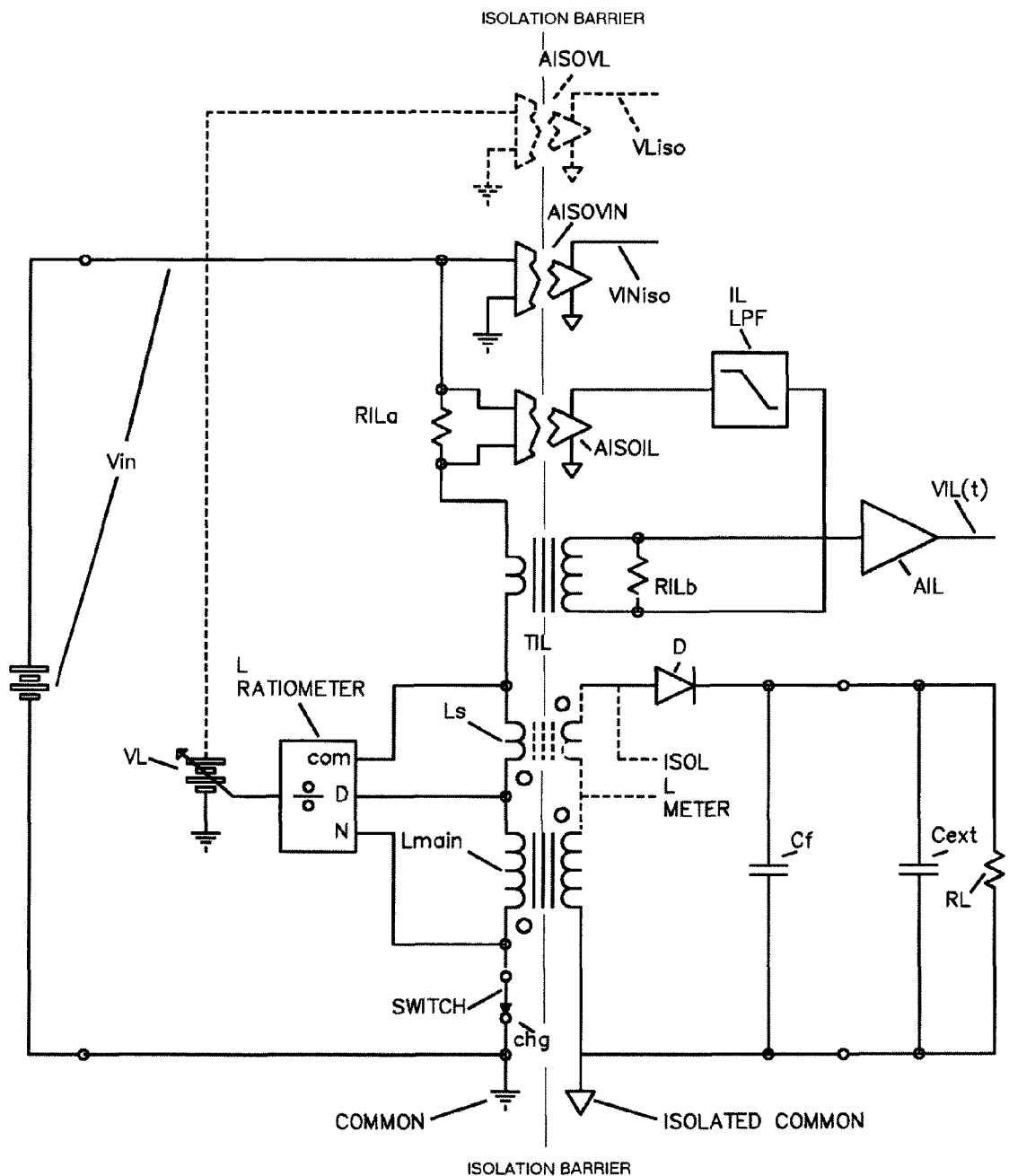
FIG. 6 illustrates a method of fitting a flyback-type converter according to this invention with components to provide a galvanic isolation barrier between its input terminals and its output terminals.

FIG. 6 illustrates a method of fitting a flyback-type converter according to this invention with components to provide a galvanic isolation barrier between its input terminals and its output terminals.

For this adaptation let it be assumed that the computation circuitry shown in FIG. 1 will reside on the output side of said isolation barrier. The circuitry of FIG. 1 for predicting the signal KEin should be removed or disabled, because in the isolated flyback converter energy from the input cannot cross the isolation barrier during flyback to appear at the output. VIL(t) must be adjusted to accommodate any turns-ratio applied, and VL must be adjusted to accord with the square of that ratio.

The isolation of Lmain is a simple matter, it simply gets another winding to become a transformer. If Ls is large relative to Lmain one may choose to make it also a transformer of turns-ratio equal to or properly related to the turns-ratio of Lmain and its new winding. In this case one may move the LRATIOMETER to the output side of the isolation barrier as shown by dashed lines.

Alternatively, if Ls be relatively small, one may retain the ratiometer on input side and pass VL across the isolation barrier using an isolation amplifier well known in the art such as is described in U.S. Pat. Nos. 4,395,647 and 4,383,222 or their more recent counterparts, ADC's and DAC's with optical or magnetic links, V-F and F-V converters with such links, or one of a plethora of other well-known isolation techniques.

VIN may be passed across the barrier using the same techniques as for VL.

The passing of VIL(t) across the barrier is slightly more complex. The chosen isolation amplifier or other circuitry may not possess sufficient bandwidth to pass this signal with adequate fidelity. A current transformer might be used, but the latter is implicitly a high-pass filter, not passing DC information. A solution is to use both an isolation amplifier or other circuitry and a current transformer. In this figure current transformer TIL with burden resistor RILb can pass AC components of IL from about 1 KHz to several hundred MHz. The corner frequency of TIL can be set by setting the time constant of its own inductance divided by RILb. The current IL also passes through RILa dropping a proportional voltage which is fed to isolation amplifier AISOIL that brings the DC information of IL across the isolation barrier. The signs and gains of the AC portion passing through TIL and the DC portion passing through AISOIL should be made properly to correspond, perhaps having equal gains and signs. The AC and DC portions of the IL information may be summed as shown or by many other well-known circuits. If there is overlap of the passbands of TIL and AISOIL, a low-pass filter ILLPF may be used to remove said overlapping response. Alternatively, if the corner frequencies of the two paths be set equal, ILLPF may be eliminated. Equalizing said corner frequencies produces a smooth crossover resulting an a substantially flat response from DC to a very high frequency.

An amplifier AIL may be needed properly to scale VIL(t).

Such a technique for conditioning VIL is also useful in non-isolated converters where relatively large voltages sometimes make galvanically-connected sampling of the IL information undesirable.

Figure 7:
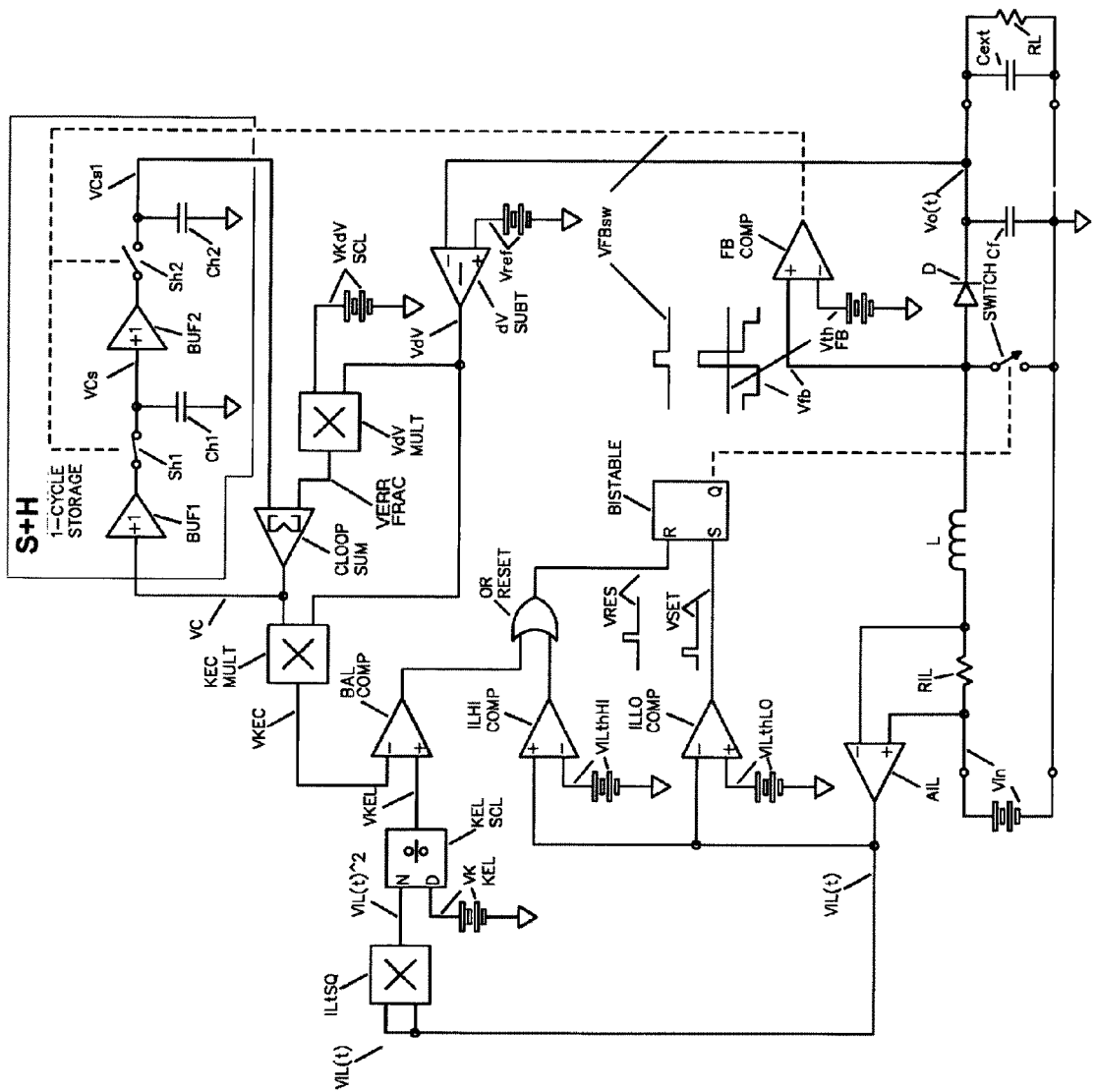
FIG. 7 illustrates a flyback-type converter comprising a asynchronous regulator of the present invention, having a servo-loop for its capacitive energy term.

FIG. 7 illustrates a flyback-type converter comprising a asynchronous regulator of the present invention, which operates as follows:

As in prior-art flyback regulators, one pole of an inductive reactor is connected through any sampling resistor, to one terminal of an input voltage source. Switches, one of which may be a diode, cyclically and alternately connects a remaining pole of said inductive reactance to a remaining pole of said voltage source and to an output filtration capacitance and a load, which are in turn returned to said input voltage source. The duty-cycle of this switching relates an output voltage minus said input voltage, to said input voltage.

Whilst an inductor L is charged, its current, IL, rises. As IL rises, so does the kinetic energy contained in the inductive field IL, passing through RIL drops a voltage proportional thereto. Amplifier AIL generates a voltage signal VIL(t) that represents the instantaneous value of IL.

Now we depart from the prior art. VIL(t) is applied to both inputs of multiplier ILtSQ, which generates a signal VIL(t)^2 that represents the square of the instantaneous value of IL.

Said signal VIL(t)^2, which is proportional to energy in inductor L, is applied to one input of divider KELSCL, and a scaling signal VKKEL is applied to the other input thereof, to yield a product, VKEL, representing the kinetic energy predicted to be available from inductor L.

Output voltage Vo(t) has some instantaneous value that may be above, below, or equal to correspondence with a desired voltage, Vref, and an object of the present invention is to cause Vo(t) to correspond with said desired voltage at some time in the switching cycle. This arbitrarily chosen time is at the end of the cycle after the inductor has been charged and discharged. To this end it is desirable to predict how much energy the capacitance will require to be charged to a desired voltage were inductive discharge to commence immediately.

Since the ripple of the regulator of this invention is small, Vo(t) contains a good piecewise-linear approximation of the energy required to charge total capacitance, Cf plus Cext, to a desired voltage Vref.

Regulators according to this invention robustly attempt to restore Vo(t) as just described. Moreover, said regulators tend correctly to maintain energy balance even when their internal reports of inductance and capacitance are incorrect, as long as these energies are reported in substantially correct ratio. Inasmuch as the primary function of said regulators is to regulate, these propensities can be exploited to simplify regulators according to this invention, albeit with the loss of correct reports of inductance and capacitance, as will be described hereinbelow.

Should the instantaneous voltage at VC incorrectly report the ratio of inductance to capacitance, the L/C ratio, Vo(t) fails correctly to correspond to Vref. Subtractor dVSUBT generates a signal VdV that represents the sign and the amount of the failed correspondence, or error. VdV is fed to one input of multiplier, VdVMULT, and a scaling voltage, VKdV, is applied to the other input of said multiplier, to generate a signal, VERRFRAC, representing a predetermined fraction of said error. The polarity of VERRFRAC is made to tend to correct errors of VC as follows. Sample-hold S+H, comprising BUF1, Sh1, Ch1, BUF2, Sh2, and Ch2, of conventional structure, stores the present value of VC for at least one cycle, producing a signal VCs1. Summer CLOOPSUM adds VERRFRAC to VCs1 to produce a new and more correct value of VC, which is used in a subsequent cycle. Thus errors in this regulator's L/C ratio are decimated within a few cycles to produce a corrected value of VC.

Said correct value of VC is applied to one input of multiplier KECMULT Whilst to the other input of said multiplier VdV is applied. VdV contains information proportional to the amount of energy that will be required correctly to restore Vo(t) to proper correspondence with Vref. The product of this multiplication is the signal VKEC, that is proportional to energy needed properly to replenish the total output capacitance of the regulator according to this invention. VKEL and VKEC are applied to the inputs of energy balance comparator, BALCOMP, which produces a reset signal VRES when the former exceeds the latter. This reset signal, passing through an OR gate, ORRESET, resets a flip-flop, BISTABLE, which in turn opens a switch, SWITCH, terminating the charging and commencing the discharging of inductor L.

The other input of ORRESET is responsive to excess current in inductor L, being driven by a comparator ILHICOMP, which generates a reset whenever VIL(t) exceeds a threshold voltage VILthHI. This excess current reset function protects the regulator from excess current in accordance with prior art. Since, in this asynchronous regulator, the time to discharge inductor L may be made as long as is desired, there is no energy turnaround such as is manifested by synchronous regulators. In an asynchronous regulator, a current limit suffices both to protect components and to prevent undesirably long chopping cycles.

When charging is terminated, the current in inductor L continues to flow, turning on a diode D, or a synchronous rectifier, and supplying load current and replenishing regulator output capacitance. Signal VIL(t) is applied to one input a comparator, ILLOCOMP, which generates a set signal, VSET, whenever VIL(t) falls below a threshold voltage, VILthLO. Thus, when inductor L has been sufficiently discharged, BISTABLE is set, which in turn closes SWITCH, commencing another cycle by charging inductor L.

In turning on diode D when it supplies current, inductor L generates voltage in excess of Vo(t), and in excess of VIN. The inductor is said to "fly back" as it discharges. The voltage of inductor L is connected to one input of a comparator FBCOMP, to the other input of which is connected a threshold voltage, VthFB. FBCOMP thus generates a signal VFBsw during flyback time, i.e. the discharge of inductor L. Said signal VFBsw drives the switches of the sample-hold, S+H.

If VKKEL be correctly scaled to the actual value of L, the propensity for the control loop of the regulator of this invention to seek the correct output voltage will cause a correct report of total capacitance by the signal VC. If, however, VKKEL be mismatched to L, this regulator will still regulate well, but it will wrongly report the value of total capacitance. In this case, its transient response may be slightly degraded.

The signal VKdVSCL determines the fraction of error correction per cycle. For instance, a high value of VKdVSCL would result in quicker response to an abrupt change in capacitance, but with more likelihood of overshoot, whilst a low value would produce slower correction without overshoot. One slight disadvantage of this embodiment relative to more complex embodiments is that the fractional per-cycle correction of its capacitive feedback loop limits the rate at which capacitance corrections can be made. This presents a problem only when sudden changes of capacitance are made. A sudden addition of significant capacitance produces a temporary output voltage droop and a sudden removal of significant capacitance produces a temporary output voltage spike. If said spike presents an application problem, it is a trivial matter to add a reset signal to ORRESET when output voltage exceeds desired voltage by a chosen fraction.

The propensity of the energy balance feedback loop of this invention to seek correct output voltage, regardless of line or load variations and regardless of total capacitance, is so strong that in this simplified embodiment many smaller terms that are addressed explicitly in other figures of this invention are simply obliterated by the action of the capacitance feedback loop described above.

Figure 8:
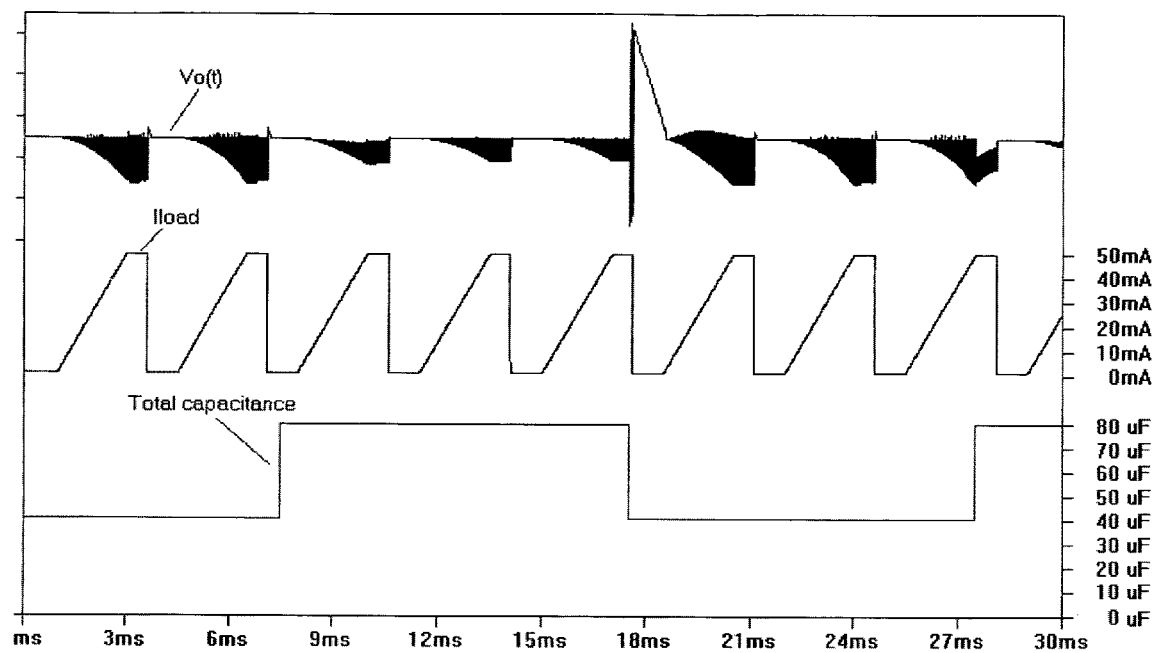
FIG. 8 illustrates the output waveform as the regulator of FIG. 7 is exercised by a ramp load change and by a capacitance change.

FIG. 8 illustrates the output waveform as the regulator of FIG. 7 is exercised by a ramp load change from 1 mA to 50 mA, and by a capacitance change from 40 µF to 80 µF. It should first be noted that ripple is substantially inversely proportional to capacitance. Secondly it should be noted that for this figure the regulator of FIG. 7 was exercised by an external capacitor of 40 µF having alternately been switched to connect to, and not to connect to, the output terminals of said regulator. No adjustment was applied to said regulator to adapt it to said capacitance change, but said regulator automatically adapted to said capacitance change. The slight droop of the peaks of Vo(t) at about 9.7 mS of this record result from less than immediate adaptation. The absence of a similar droop between 12 mS and 14 mS show that by this time said regulator had adapted to said capacitive change.

The spike at about 17.5 mS results from an abrupt change of capacitance at full load. The computation circuitry puts enough energy to charge a relatively large capacitor into a small one, resulting in a temporary small over-voltage condition which is immediately followed by a sudden load removal. Now charge is trapped in the filter capacitor and, save implementing additional circuitry to discharge the latter, the only way for that charge to be dissipated is to allow the load to drain it away, as it does during the ramp from 17.6 mS to 18.5 mS. When Vo(t) has just about recovered at 18.5 mS, a new load ramp commences to exercise said regulator at minimum capacitance. The hump of the peaks of Vo(t) between 18.5 mS and 20.9 mS result from less than immediate adaptation to the latest capacitance change, and is analogous but of opposite polarity to the droop between 12 and 14 mS. As with the aforementioned droop, the regulator adapts by the next load cycle, producing substantially no hump between 22.2 mS and 24.5 mS.

Figure 9:
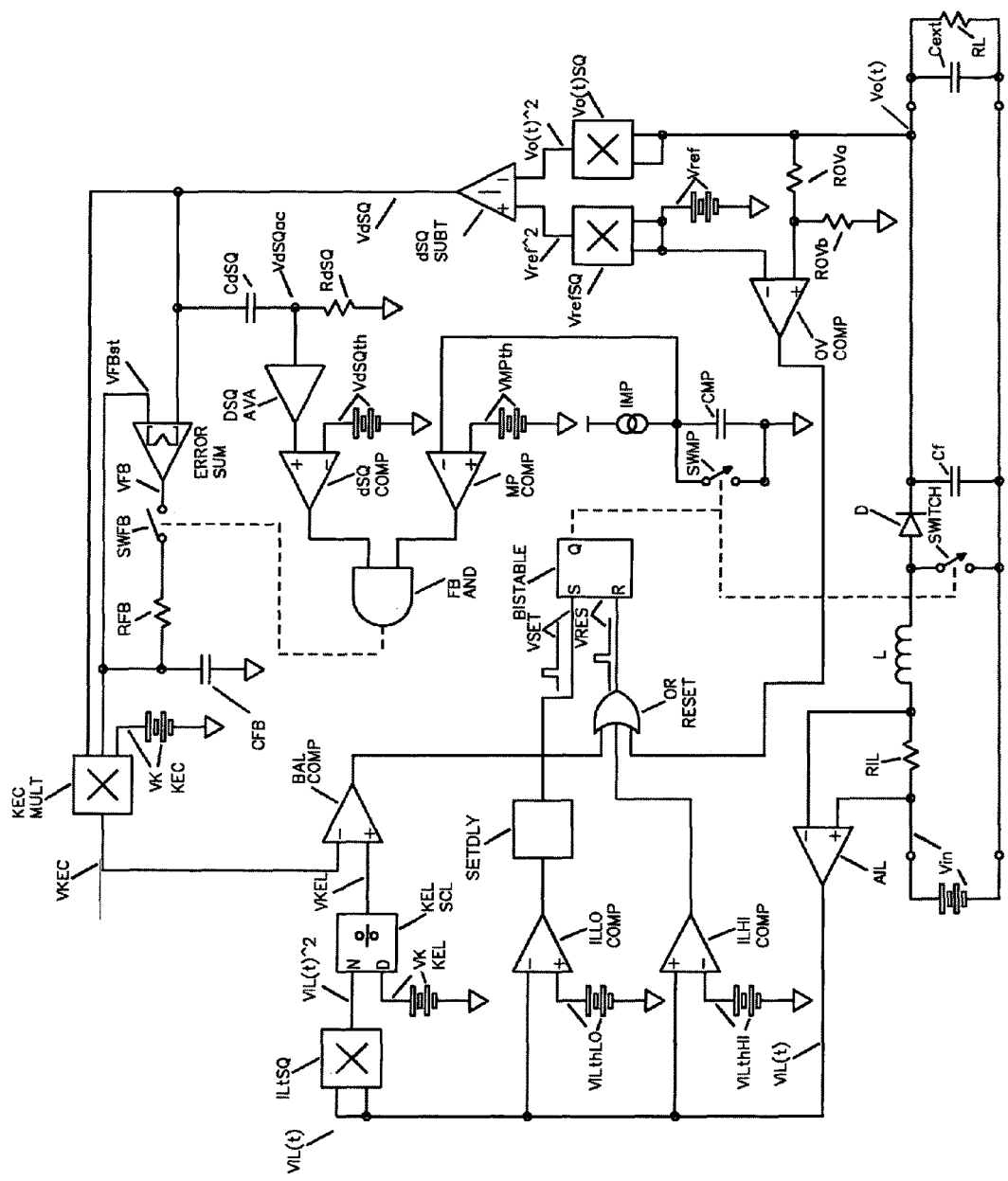
FIG. 9 illustrates a flyback-type converter comprising a asynchronous regulator of the present invention, having a simplified servo-loop for its capacitive energy term

FIG. 9 illustrates a flyback-type converter comprising a asynchronous regulator of the present invention, which operates similarly to that of FIG. 7, but is slightly simpler.

The inductive energy portion of this embodiment operates identically to that of FIG. 7. The propensity of this embodiment to seek correct output voltage is similarly robust.

Vo(t) is fed to both inputs of multiplier Vo(t)SQ which produces a signal, Vo(t)^2, representing the square of Vo(t). Similarly Vref is fed to both inputs of multiplier Vref^2 which produces a signal, Vref^2, representing the square of Vref. These two signals representing squares are fed to subtractor dSQSUBT, which generates a signal, VdSQ, representing Vref^2−Vo(t)^2 and proportional to capacitive energy, which is, in turn, fed to one input of multiplier KECMULT. VdSQ is also fed to summer ERRORSUM, the output of which produces a feedback signal VFB. An averaging hold circuit, of conventional structure, comprising SWFB, RFB, and CFB stores the present value of VFB for at least one-half cycle, producing a signal VFBst. The time constant of RFB and CFB is preferably roughly five times the period of a chopping cycle with the regulator fully loaded. VFBst is fed back to the remaining input of ERRORSUM. By the circuitry just described, errors of Vo(t) cause said signal VFBst, when applied to the another input of KECMULT, to tend to annihilate the Vo(t) error that was its genesis. A scaling signal VKKEC correctly scales the capacitive energy VKEC so that the size of VFBst will be manageable. No signal directly representing total capacitance is generated, but that is of little importance unless one is making a capacitance meter. The output of KECMULT still represents capacitive energy, which is still balanced against inductive energy, causing good regulation with good transient response. The adaptability of the servo loop comprising the aforementioned hold circuit endows this embodiment with ability to adjust itself to various inductances and total capacitances as in several of the previously described embodiments of this invention.

The signal VdSQ is also applied to an AC coupling circuit comprising CdSQ and RdSQ, the time constant of which is preferably roughly 20 times the period of a chopping cycle with the regulator fully loaded. This high pass filter produces the AC coupled signal VdSQac. This AC coupling is not vital to the operation of this embodiment, since it merely centers the output ripple on the desired voltage. Omission of this AC coupler will cause the peak, rather than the center, of output ripple to be near the desired voltage.

Signal VdSQac is fed to absolute value circuit (precision full-wave rectifier) DSQAVA, the output of which is compared by comparator dSQCOMP with threshold voltage VdSQth to cause a signal that is fed to one input of AND gate FBAND. The output of BISTABLE drives a switch SWMP that discharges a capacitor CMP that is constantly being fed a current from a current source, IMP. As long as BISTABLE is toggling, CMP is prevented from charging to a significant voltage. However, should the regulator be temporarily out of regulation, for instance in the event of a sudden capacitance change, BISTABLE may stop toggling. If that happens, CMP may become sufficiently charged to reach the voltage of a threshold signal, VMPth. Thus SWMP, CMP, IMP, and MPCOMP form a missing-pulse detector of conventional character. The output of MPCOMP feeds the remaining input of FBAND. The output of FBAND drives the hold circuit switch SWFB. Thus error corrections of the value of capacitive energy occur at the centers of output of ripple waves, unless they are interrupted by an out-of-regulation signal from said missing pulse detector acting though FBAND.

It is possible, at low loads, for this embodiment to toggle so quickly that significant switching losses might be incurred in its main switch, SWITCH. A small delay, SETDLY, perhaps 500 nS for a regulator running in the 100 KHz region, is added in the set path of BISTABLE to limit the maximum toggling rate of this regulator.

The behavior of the embodiment of this invention shown in this figure (FIG. 9) differs in one detail from those previously described. Whereas other embodiments tend to regulate the upper peak of output ripple to accord with desired reference voltage, this embodiment causes the average of output ripple so to correspond. Thus, having both small ripple and a desired average value, this embodiment is particularly advantageous for precision applications and those where slight post-filtration to achieve vanishingly-small ripple would be advantageous. In such applications, for instance supplanting linear regulators, this embodiment offers more than low noise inasmuch as its transient response to line, load, and capacitance is not only superior to prior art switched regulators but also surpasses the dynamics of many prior art linear regulators whilst maintaining the efficiency of a switched regulator.

Figure 10:
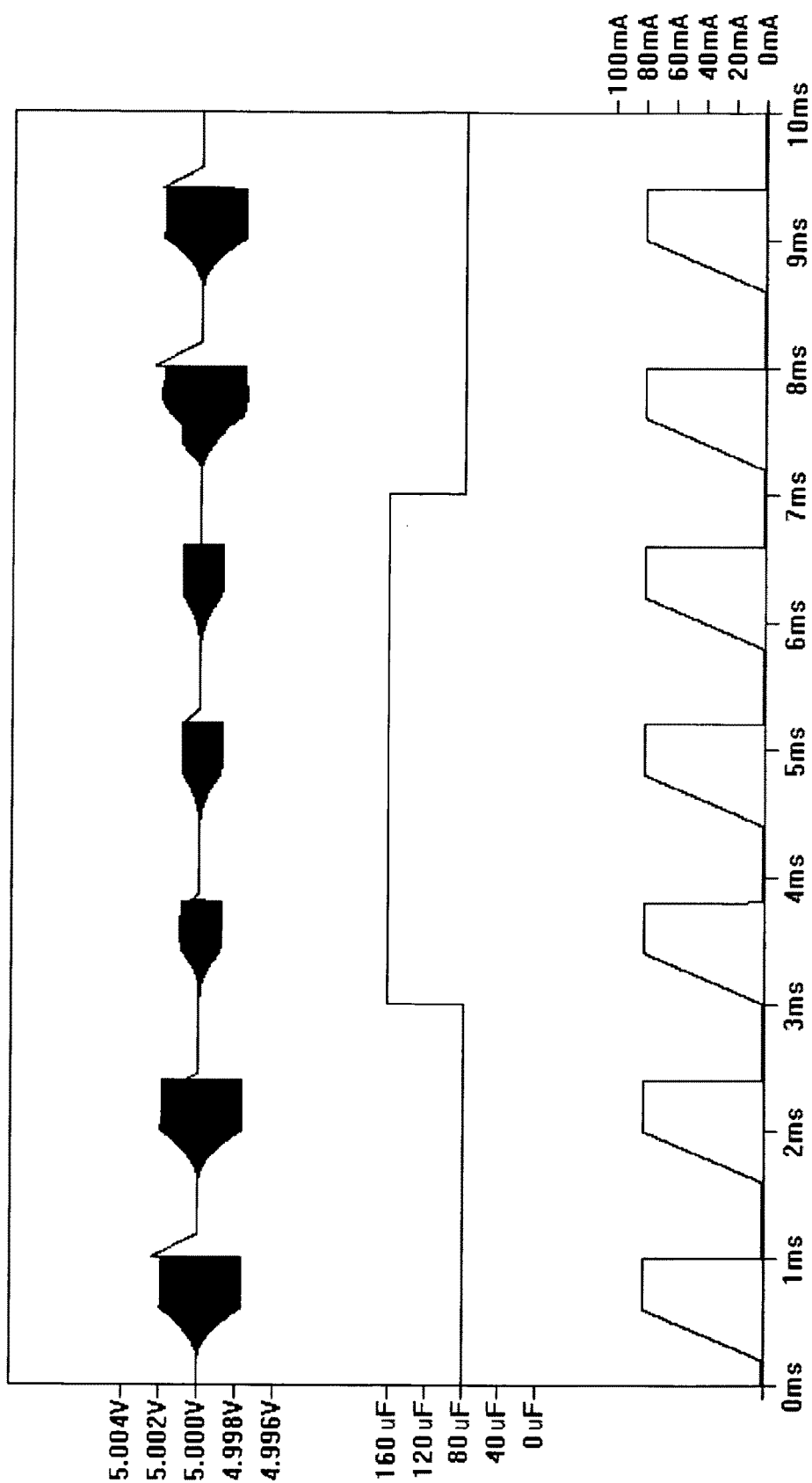
FIG. 10 shows the waveforms of FIG. 9 as the latter is exercised by load current and capacitance changes.

FIG. 10 shows the output waveform of FIG. 9 as the latter is exercised by load current changes between 1 mA and 80 mA and total capacitance changes between 80 µF and 160 µF.

Figure 11:
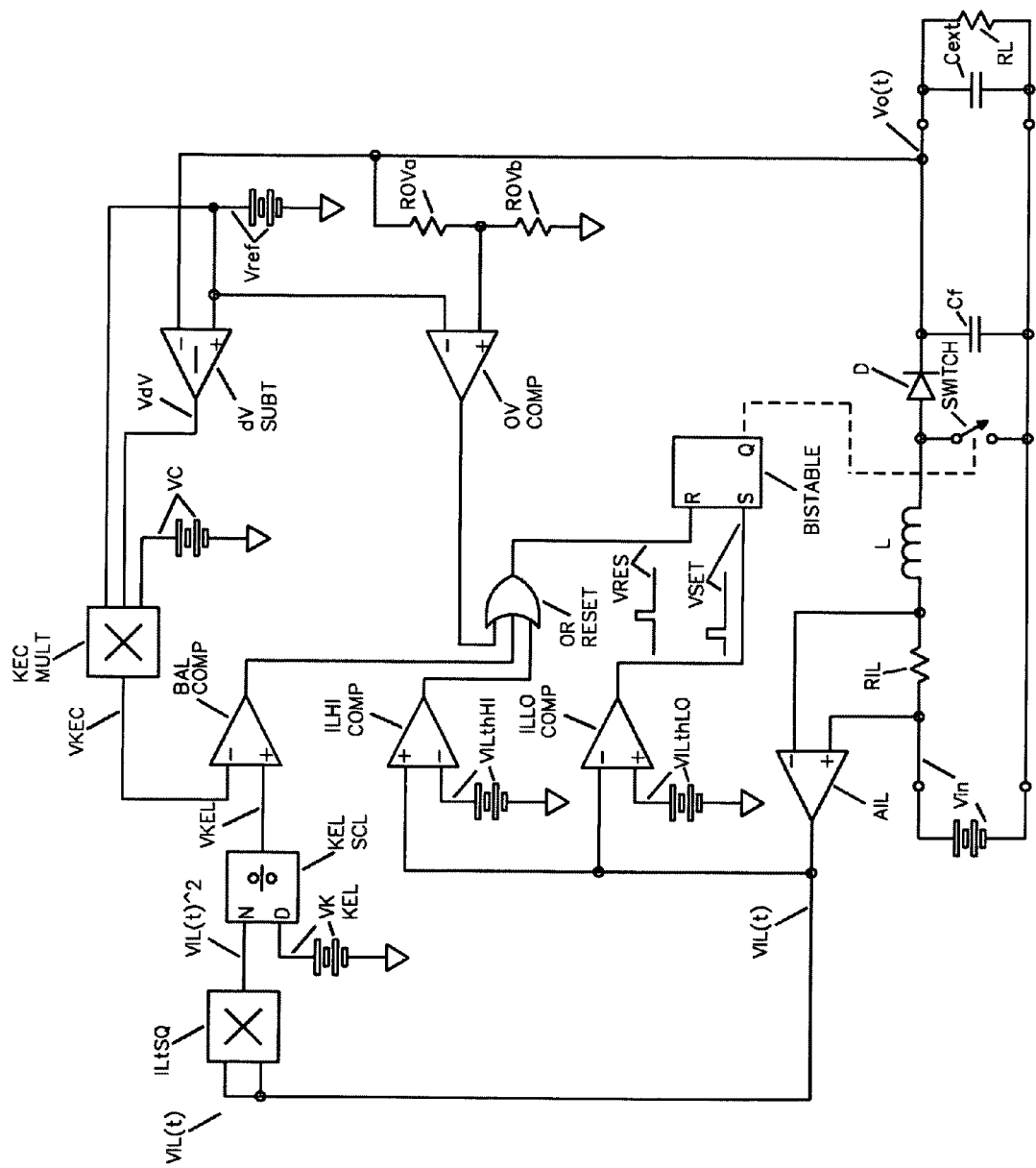
FIG. 11 illustrates a flyback-type converter comprising a asynchronous regulator of the present invention.

FIG. 11 illustrates a flyback-type converter comprising a asynchronous regulator of the present invention, which operates as follows:

The inductive energy portion of this embodiment operates identically to that of FIG. 7, and its propensity to seek correct output voltage is similarly robust.

Vo(t) has some instantaneous value that may be above, below, or equal to correspondence with a desired voltage, Vref, and an object of the present invention is to cause Vo(t) to correspond with said desired voltage at some time in the switching cycle. This arbitrarily chosen time is at the end of the cycle after the inductor has been charged and discharged. To this end it is desirable to predict how much energy the capacitance will require to be charged to a desired voltage were inductive discharge to commence immediately.

Since the ripple of the regulator of this invention is small, Vo(t) contains a good piecewise-linear approximation of the energy required to charge total capacitance, Cf plus Cext, to a desired voltage Vref.

In this embodiment, it is assumed that one knows the L/C ratio, and Vc is represented by a constant signal or by a signal from other circuits for determining L/C ratio.

The signal VC is applied to one input of multiplier KECMULT, whilst to another input of said multiplier VdV is applied, and to yet another input of said multiplier Vref is applied.

VdV contains information proportional to the amount of energy that will be required correctly to restore Vo(t) to proper correspondence with Vref. The product of this multiplication is the signal VKEC, that is proportional to energy needed properly to replenish the total output capacitance of the regulator according to this invention. VKEL and VKEC are applied to the inputs of energy balance comparator, BALCOMP, which produces a reset signal VRES when the former exceeds the latter. This reset signal, passing through an OR gate, ORRESET, resets a flip-flop, BISTABLE, which in turn opens a switch, SWITCH, terminating the charging and commencing the discharging of inductor L.

Another input of ORRESET is responsive to excess current in inductor L, being driven by a comparator ILHICOMP, which generates a reset whenever VIL(t) exceeds a threshold voltage VILthHI. This excess current reset function protects the regulator from excess current in accordance with prior art.

Yet another input of ORRESET prevents excess output voltage. Should a desired fraction, set by ROVa and ROVb, of the output voltage V0($t$), exceed Vref, ORRESET will reset BISTABLE, which in turn opens a switch, SWITCH, terminating the charging and commencing the discharging of inductor L.

When charging is terminated, the current in inductor L continues to flow, turning on a diode D and supplying load current and replenishing regulator output capacitance. Signal VIL(t) is applied to one input a comparator, ILLOCOMP, which generates a set signal, VSET, whenever VIL(t) fall below a threshold voltage, VILthLO. Thus, when inductor L has been sufficiently discharged, BISTABLE is set, which in turn closes SWITCH, commencing another cycle by charging inductor L.

The simplified regulator of this figure has a slight tendency for output voltage to rise with load. This tendency may be compensated by adding a small, about 2%, additional term responsive to inductor current to the inductive energy term. Accordingly, the energy term KEL of FIG. 7 be P*IL^2, KEL for this figure might be made P*(IL^+IL/50), the fraction of IL thus applied being non-critical.

In this embodiment, inductive energy is balanced against the energy of a known capacitor. This embodiment is particularly well-suited for digital implementation of its computation circuitry inasmuch as point of correspondence of the its ripple voltage can be set responsively to the timing of its error comparison.

Figure 12:
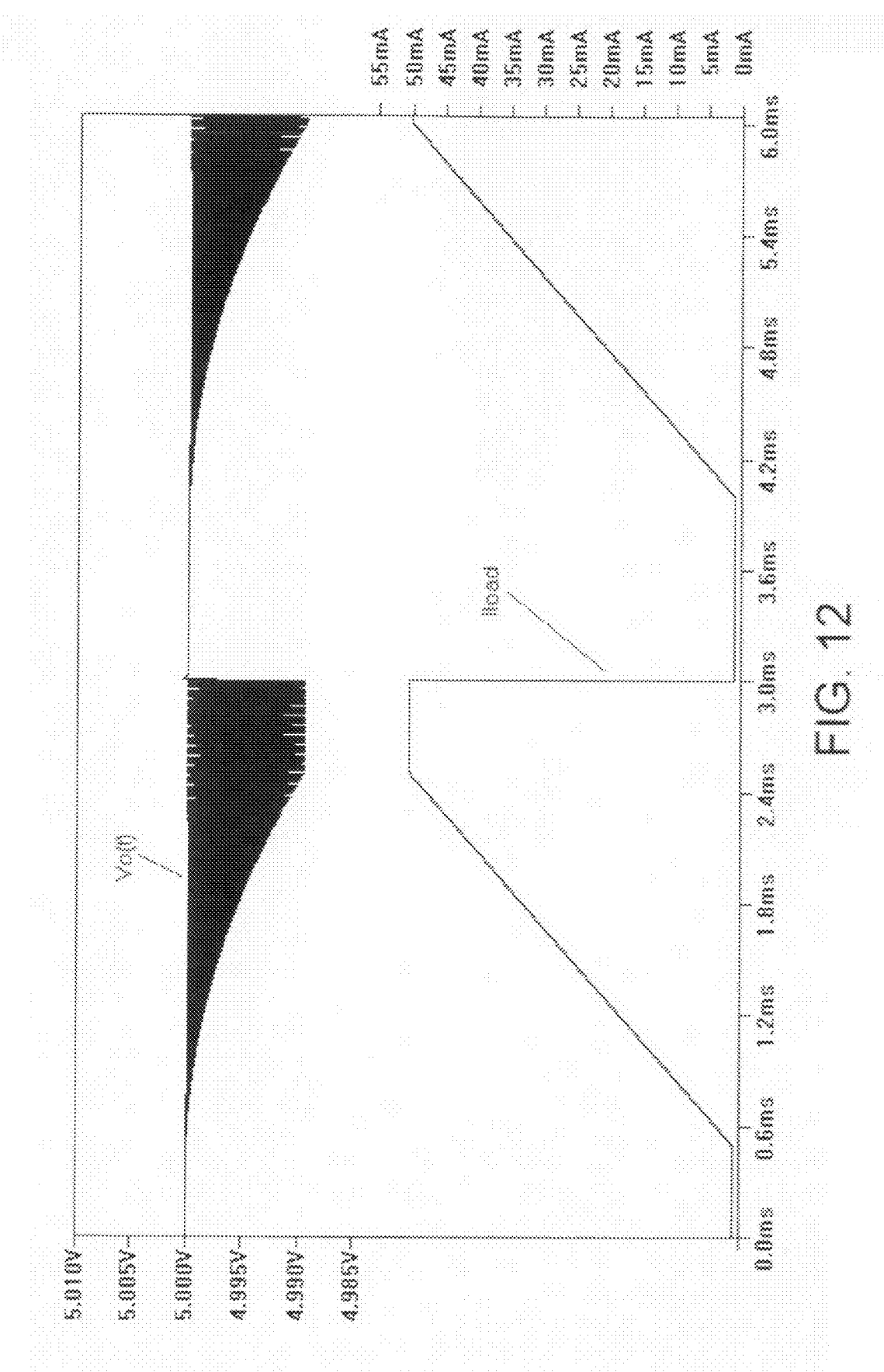
FIG. 12 shows the output waveform of the regulator of FIG. 11 when the latter is exercised with the ramp load current.

FIG. 12 shows the output waveform of the regulator of FIG. 11 when the latter is exercised with the ramp load current, Iload, as shown. Note that, in this embodiment, since correspondence with a desired voltage is arbitrarily chosen to occur at the end of the discharge of inductor L, and that time is associated with the peak of output ripple, the top of the ripple of Vo(t) is corresponding with the desired voltage, in this case, 5V. The excellent transient response at 3.0 mS results from the lack of any need for this regulator to adapt to changes of its reactive components. It is merely responding to load changes.

Figure 13:
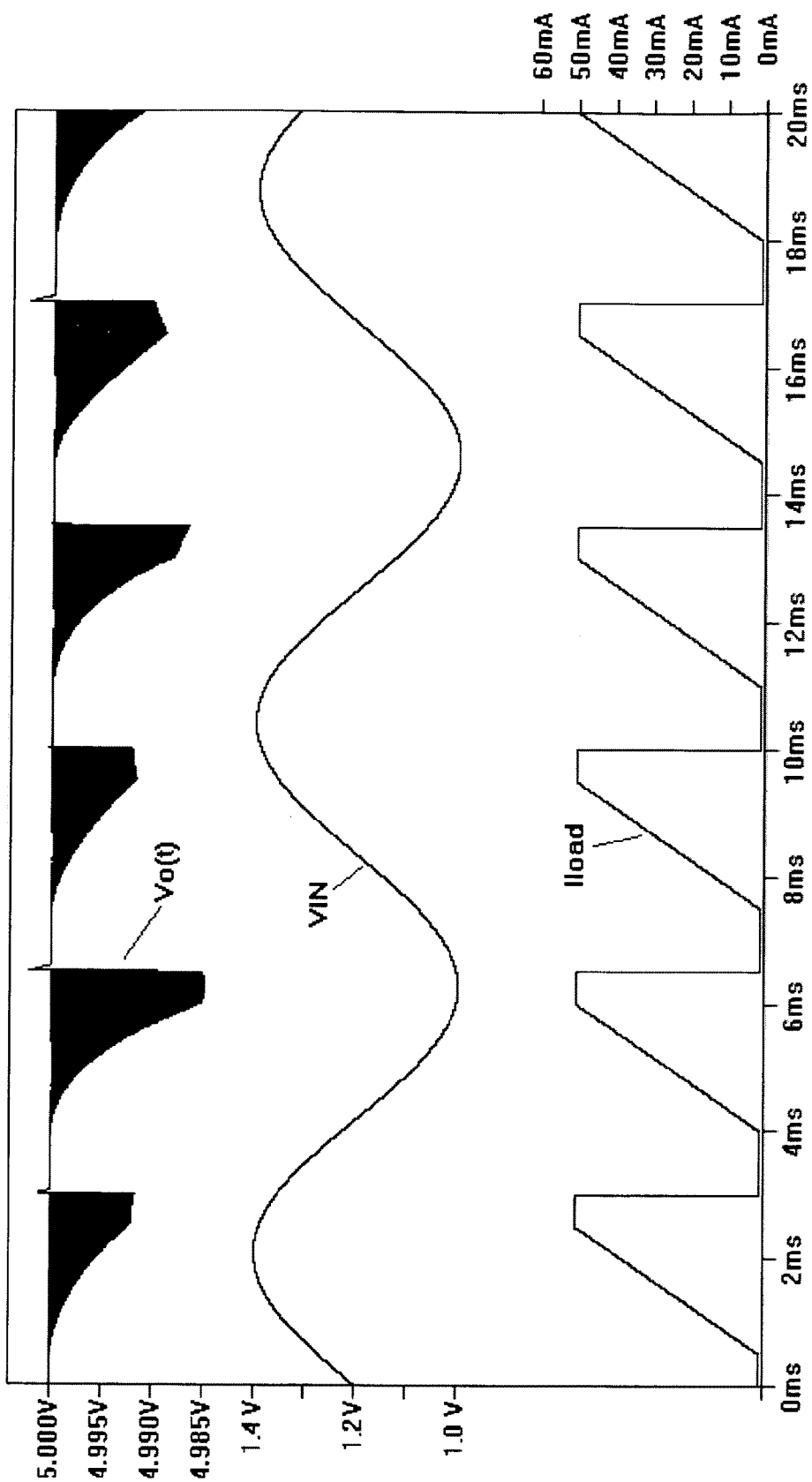
FIG. 13 shows the output waveform of the regulator of FIG. 11 when the latter is exercised with a varying input voltage.

FIG. 13 is like FIG. 12 but also shows the effect of a varying input voltage, VIN, upon the regulator of FIG. 11. The bottom of the loaded ripple of Vo(t) is changing as this regulator responds to changes of VIN. As VIN varies, its ratio to the sum of Vo(t) plus itself varies. This variation of ratio, to equalize the positive and negative volt-time products applied to inductor L during charge and discharge respectively, requires variation of duty-cycle as part of the regulation function. This variation of duty cycle, together with frequency variation, since this is an asynchronous regulator, produces the variation of the ripple of Vo(t) shown in this figure.

Figure 14:
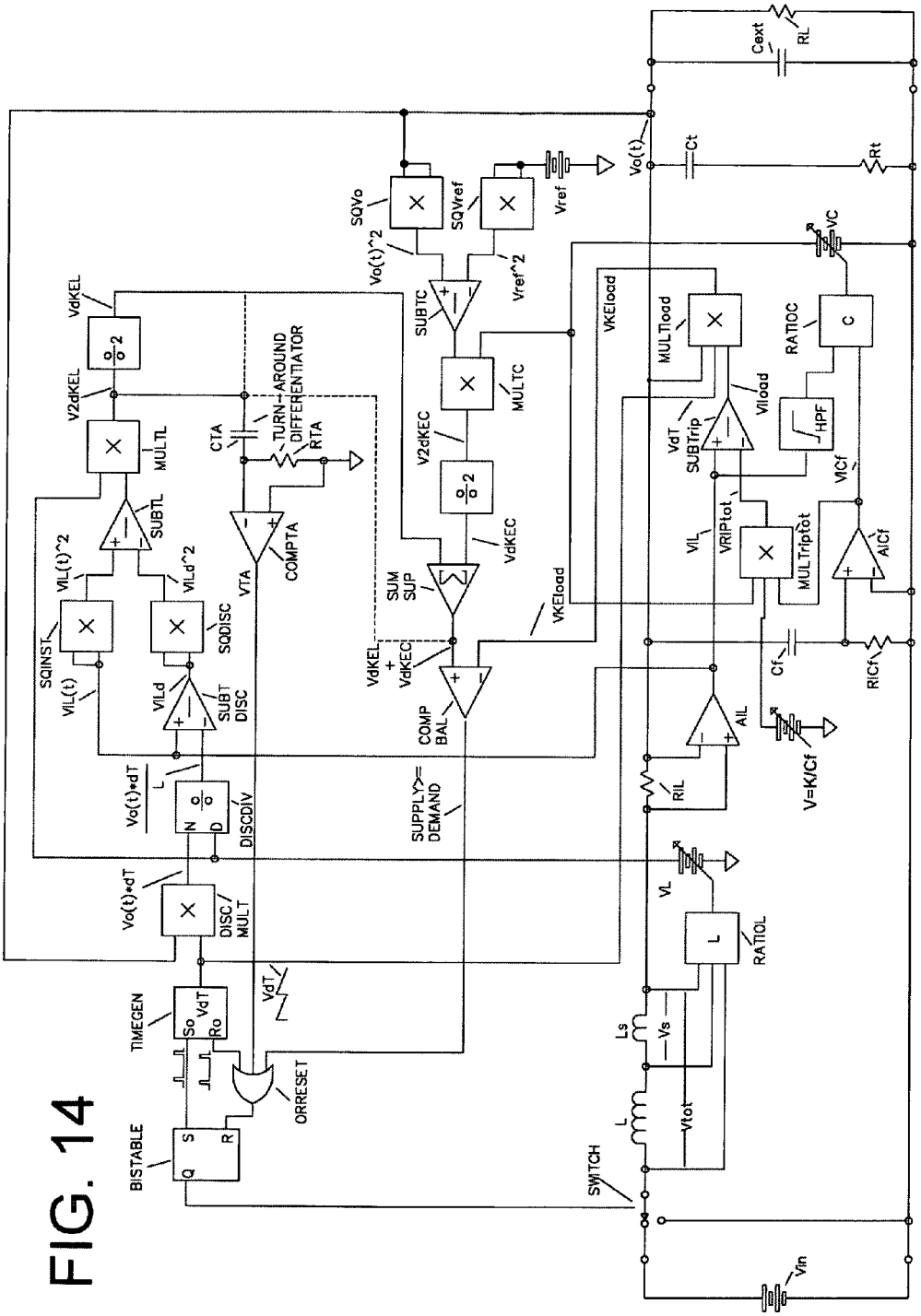
FIG. 14 illustrates a buck-type converter into which the regulator of the present invention has been included.

FIG. 14 illustrates a buck-type converter into which the regulator of the present invention has been included.

The buck converter according to the present invention, illustrated in FIG. 14, operates as follows:

As in prior-art buck regulators, a switch cyclically and alternately connects an inductive reactance to the two terminals of an input voltage source. To begin a chopping cycle, a timing generator sets a flip-flop which connects said inductive reactance to a positive terminal of said source. The remaining pole of said inductive reactance is connected, through current sampling resistor, RIL, to output filtration capacitance and a load which are in turn returned to said input voltage source. The duty-cycle of this switching activity determines regulator average output voltage, which when filtered yields a substantially DC output voltage.

At this point we begin to depart from prior-art regulation techniques. Whilst an inductor comprising the sum of L and Ls is connected to the positive pole of voltage source Vin, its current, IL, rises. As IL rises, so does the kinetic energy contained in the inductive field: IL, passing through RIL drops a voltage proportional thereto. Amplifier AIL generates a voltage signal VIL(t) that represents the instantaneous value of IL.

Now we sharply depart from the prior art. VIL(t) is applied to both inputs of multiplier SQINST which generates a signal VIL(t)^2 that represents the square of the instantaneous value of IL.

Since is usually is not practical or desirable to operate a buck converter at a low frequency, there may be a limit set on the period of the cyclic switching of the regulator. To begin charging the inductor a timing generator TIMEGEN sets a flip-flop BISTABLE which in turn connects said inductor to the positive terminal of Vin. At the same time, the timing generator issues a descending ramp waveform VdT that represents the time remaining in the present switching cycle.

Since infinite time is not available to discharge the inductor, and neither is infinite voltage available to discharge it in infinitesimal time, it may become impossible to extract all of the energy in its field in a given cycle. The available time may limit the discharged value of IL, ILd.

Since, upon switching to a discharging state, the inductor will be connected between any voltage at the regulator output and the negative terminal of Vin, the dominating voltage across the inductor during discharge will be the output voltage V0(*t*). Therefore ILd will accord with the equation ILd=1L(t)−(Vo(t)*dT/L). To obtain a signal representing ILd, VO(t) and VdT are applied to the input of discharge multiplier DISCMULT. Their product Vo(t)*VdT becomes the dividend of discharge divider DISCDIV. A signal VL represents the value of the summed inductance of L and Ls. Ls is an auxiliary inductor that comprises a standard for a ratiometric measurement of L. If the value of L is adequately known and stable, Ls may be omitted along with inductance meter ratiometer RATIOL, and a constant signal VL may represent L in the calculations according to this invention.

VL is the divisor input to DISCDIV, which in turn outputs a signal Vo(t)*dT/L representing the change of IL during discharge. Subtractor SUBTDISC subtracts the latter from VIL(t) to provide the signal VILd, representing the predicted IL at the end of the present cycle, were discharge to commence at present instant. VILd is applied to both inputs of multiplier SQDISC which generates a signal VILd^2 that represents the square of the discharged value of IL.

Subtractor SUBTL generates a signal representing the difference of VIL(t)^2 and VILd^2 which is applied to one input of multiplier MULTL. VL is applied to the other input thereof, to yield a product V2dKEL, which when divided by 2 becomes a signal VdKEL, representing the kinetic energy predicted to be available from the inductor were inductive discharge to commence immediately and continue until the end of the present cycle.

As L charges, IL passes both into a load RL and into an internal filter capacitor Cf and any external capacitance Cext associate with RL. Vo(t) has some instantaneous value that may be above, below, or equal to correspondence with a desired voltage, Vref, and an object of the present invention is to cause Vo(t) to correspond with said desired voltage at some time in the switching cycle. This arbitrarily chosen time is at the end of the cycle after the inductor has been charged and discharged.

To this end it is desirable to predict how much positive or negative energy the capacitance would yield were inductive discharge to commence immediately and continue until the end of the present cycle.

To this end, Vo(t) is applied to both inputs of multiplier SQVo to generate a signal Vo(t)^2 representing the square thereof. Vref is likewise applied to both inputs of multiplier SQVref to generate a signal Vref^2 representing the square thereof.

Subtractor SUBTC generates a signal representing the difference of Vo(t)^2 and Vref^2 which is applied to one input of multiplier MULTC. VC is applied to the other input thereof, to yield a product V2dKEC, which when divided by 2 becomes a signal VdKEC, representing the kinetic energy predicted to be available from the capacitance were inductive discharge to commence immediately and continue until the end of the present cycle.

If the value of Cf and any additional capacitance applied to the terminals of the regulator of this invention be adequately known and stable, a constant signal VC may represent C in the calculations according to this invention. If not, circuitry for determining that capacitance will be discussed hereinbelow.

Summer SUMSUP sums VdKEL and VdKEC to predict the amount of energy that both would supply were inductive discharge to commence immediately and continue until the end of the present cycle.

It is, however, also necessary to predict how much energy would be consumed by the load were inductive discharge to commence immediately and continue until the end of the present cycle.

To determine the load energy there are applied to the inputs of multiplier MULTIload the signals Vo(t), VdT, and VIload, the latter representing the load current. If the load is substantially resistive, one may choose to derive VIload from a sampling resistor in series with the regulator output, along with suitable amplification, and thus practice the present invention. To address the likely situation wherein the load is reactive or wherein it is undesirable to apply a sampling resistor, circuitry for implicitly determining load current will be discussed hereinbelow.

Balance comparator COMPBAL compares the predicted available energy VdKEL+VdKEC with the predicted energy to be consumed VKEload, and when the former exceeds the latter it generates a logical 1 at the input of OR gate ORRESET, which in turn resets BISTABLE, which in turn switches SWITCH to commence the discharging of L until the end of the present cycle when TIMEGEN will set BISTABLE anew to begin a new cycle.

Were energy balance the only reset term of the regulator of this invention, this regulator would share with prior-art regulators a propensity for destructive runaway. The root of this propensity is the fact that an inductor cannot instantaneously be discharged without infinite voltage. At the commencement of inductive charge, additional charging time increases available inductive energy. However, if one persists in time to charge the inductor until the voltage-time product available for its discharge becomes insufficient to discharge it, its available energy begins to decrease with increased charging time. In this figure illustrating the present invention, V2dKEL is fed to a slope detector comprising differentiator CTA and RTA along with comparator COMPTA. When the slope of VdKEL reverses in time, or "turns-around", a signal VTA from COMPTA is applied to ORRESET, which in turn resets BISTABLE, which in turn switches SWITCH, terminating the inductor charging cycle. The turnaround aspect of the present invention contrasts with prior art in which a certain slope of feedback must prevail lest positive feedback engender destruction of the regulator. Prior art usually avoids turnaround by arbitrary limitation of duty-cycle or averts destruction by limiting overall current draw should turnaround occur, both of which approaches can incur undesirable inefficiency of operation. The turnaround aspect of this invention may be practiced using VdKEL or a related signal as indicated by dotted lines. The turnaround aspect of this invention may be practiced using either analog slope detection as shown or an equivalent digital method such as observing the sign of the difference between successive samples of a value representing available inductive energy.

VL and VC may be generated using techniques similar to those described above for the flyback converter in FIG. 1.

A method of generating of VL as a function of inductance follows. L and Ls together comprise a total inductance. Whilst the value of L may be modulated by nonlinearities of the B-H curve of its core, Ls may chosen to have smaller inductance than L, perhaps 1% OR 10% thereof, and thus it may drop but a small AC voltage. If Ls be suitably chosen, it will preferably remain in a linear portion of its own B-H curve at the current where L is approaching saturation. Ls may also be chosen to be as accurate as desired. Since Il flows through both L and Ls, a AC voltage Vtot is dropped across their series combination whilst a smaller voltage Vs is dropped across Ls. The ratio of Vtot to Vs, provided by divider RATIOL, suitably scaled, provides a source of VL responsive to the actual value of L which may be used both for energy calculations according to this invention and to warn that L is either inadvertently of wrong value or is approaching saturation. Inductance may be determined by ratiometry using voltage ratios of series-connected inductors as shown, using current ratios of parallel-connected inductors, by implicit determination from volt-time product divided by current change as is shown in another figure of this invention. Whilst ratiometric determination of inductance is well-known, its application to energy calculation of energy in the control loop of a switching regulator is an aspect of this invention illustrated in this figure.

A method of generating of VC as a function of capacitance follows. The capacitance capable of storing energy for prediction according to the present invention comprises internal regulator filter capacitance plus any capacitance connected to the regulator output terminals. The switching cycle causes the AC current portion of IL, which is divided between internal and external capacitance according to their respective susceptances. In this figure, the current in Cf passing through sampling resistor RICf drops a voltage that is amplified by amplifier AICf to provide a signal VICf, which is in turn applied to the divisor input of ratiometer RATIOC. High-pass filter HPF substantially removes the DC component of IL, yielding a signal representing the AC portion of IL to be applied to the dividend input of RATIOC. Thus, by ratiometry, the AC portion of IL divided by the current in Cf, if Cf be accurately known, and the ratiometric output be suitably scaled, provides a source of VC responsive to the actual value of C which may be used for energy calculations according to this invention. Suitable dividend and divisor may be obtained using sampling resistors, amplifiers, and filters, as shown in this figure or by using current transformers as shown below in detail in another figure. Whilst ratiometric determination of capacitance is well-known, its application to energy calculation of energy in the control loop of a switching regulator is an aspect of this invention illustrated in this figure.

A method of generating VIload follows. In principle, simple low-pass filtration of IL yields a DC signal proportion to load current. However, in practice the slow response of a low-pass filter would deleteriously affect the transient response of a regulator control loop according to this invention. One might use a sampling resistor and amplifier at the regulator output to obtain VIload, but it is often undesirable to incur the power loss of another sampling resistor, and if the applied load be reactive, such a VIload generator will yield not a DC representation of load but one with an AC component related to the switching cycle. With reasonable output ripple, substantially all of the AC portion of IL flows not in the resistive load but in the sum of filter capacitance. With total capacitance measured and the current in Cf measured, one can multiply VICf by Ctot/Cf to reconstruct the AC portion of IL. Thus the multiplier MULTriptot generates a signal VIRIPtot. Subtractor SUBTrip subtracts VIRIPtot from VIL to yield VIload, which signal responds quickly to load changes but is relatively unresponsive to AC components of IL related to the switching cycle. This implicit and substantially instantaneous method for determining non-reactive load, even in the presence of load reactance, is an aspect of this invention illustrated in this figure.

In the buck converter, inductance and capacitance are continuously connected, forming a lumped-element transmission line section, which may exhibit disturbing resonances and reflections if not properly terminated. Ct of this figure couples terminating resistor Rt to the transmission line formed by other regulator components. Though it may contribute to filtration, Ct is not a filter capacitor. Though this regulator operates properly according to this invention with Ct and Rt present, calculation according to this invention addresses the energy of L and Ctot, the latter comprising said transmission-line section, making the regulation method of this invention an implicit terminator of resonances and reflections, thus rendering explicit termination redundant.

The reset signal of TIMEGEN may not always be vital to proper operation, but may be useful when the frequency of regulator output must be known, for example when synchronous operation of several regulators is desired.

In this embodiment, the computational functions shown are performed using well known analog techniques. Addition and subtraction may be performed using some of thousands of species of well-known operational amplifiers. Multiplication and division may be performed using Gilbert-cell devices as the Analog Devices AD734 multiplier/divider. Multiplication and division may also be performed using well-known techniques exploiting the predictable logarithmic IN behavior of BJT's. Alternatively, well known pulse-width modulation techniques may be used to perform the slower multiply/divide functions of this embodiment such as calculation of inductance and capacitance. All of these techniques may be implemented using a wide range of degrees of monolithic integration, from discrete components to monolithic integrated circuits. It is best to use fast techniques for calculation of energy terms in the computational paths responsive to IL and Vo(t), inasmuch as delay generates energy-balance error. In the calculation of the energy terms "time is of the essence." Likewise, if excellent load transient response is desired, fast techniques are needed for predicting the load energy term of this embodiment.

Figure 15:
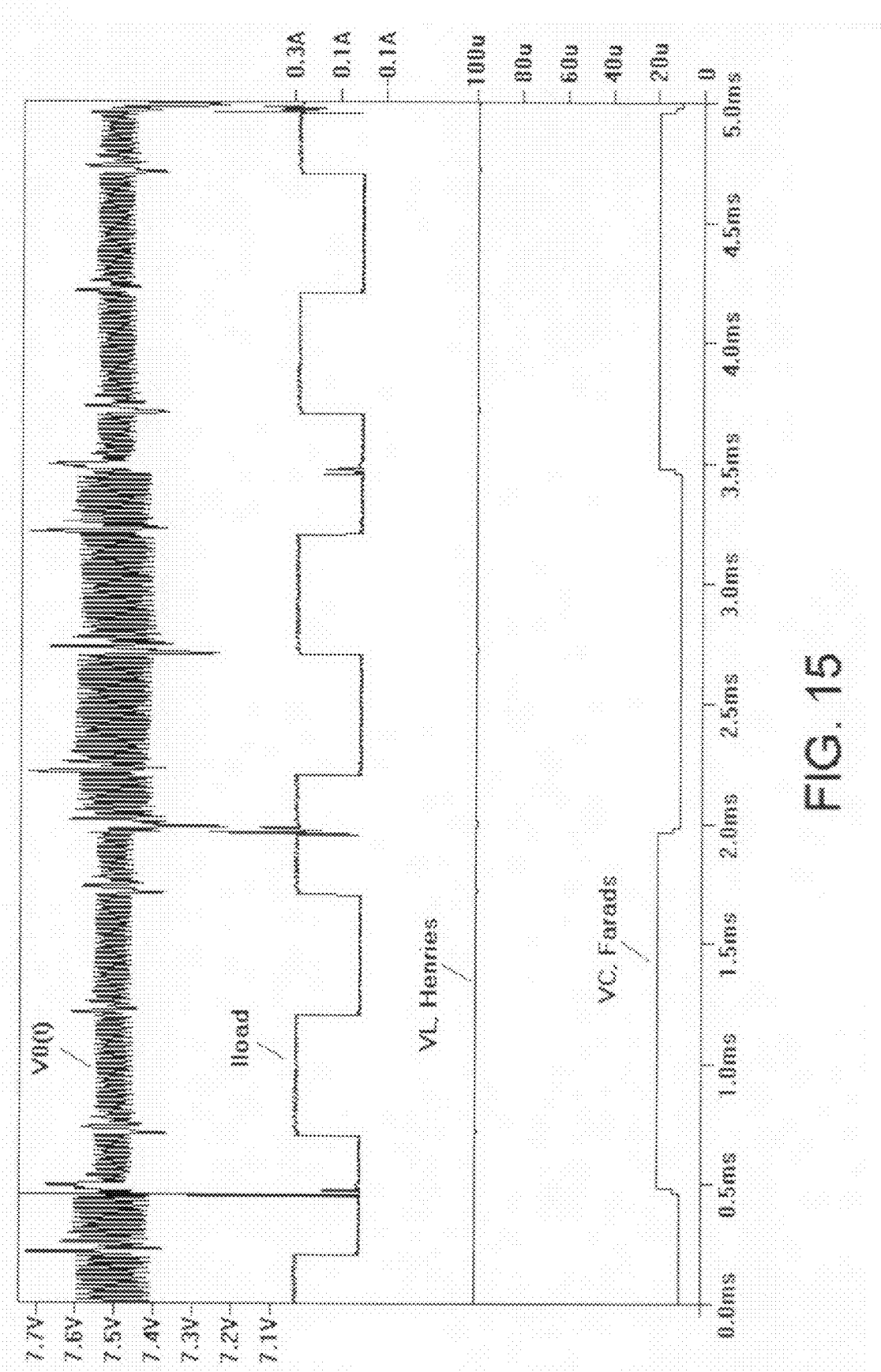
FIG. 15 illustrates waveforms generated by the buck converter of FIG. 14 as it is exercised by a varying load and by a switched capacitance.

FIG. 15 illustrates waveforms generated by the buck converter of FIG. 14 as it is exercised by a load varying from about 1 mA to about 280 mA, and by an external switched capacitance of 10 µF being switched across it terminals to parallel its internal 10 µF filter capacitor. The ripple amplitude of output Vo(t) can be seen to vary in substantially inversely proportion to total output capacitance. In this embodiment, the time of correspondence between Vo(t) and a desired voltage, in this case 7.5 volts, occurs at the end of discharge of inductor L, but that time and voltage do not correspond with a peak of ripple, thus placing the point of correspondence near the center of ripple, as can be seen in this figure. The transient at about 200 µS, and those of both polarities occurring every 500 µS thereafter result from sudden changes of load between about 1 mA and about 280 mA. These load changes are reported by a load computation circuitry comprised by this buck regulator to generate the signal load. The spikes on 1 load at about 500 µS, and occurring every 1.5 mS thereafter, result from the inability of a capacitance meter, also comprised by this buck regulator, to respond instantaneously to sudden capacitance changes. Below Iload is a record of VL, a signal produced by an inductance meter also comprised by this buck regulator. At the bottom of this record is VC, a signal produced by capacitance meter also comprised by this buck regulator. The less-than-immediate response of said capacitance meter, which occasions the aforementioned spikes on Iload, is evident in this record.

FIG. 15 illustrates the Vo(t) waveform generated by the buck converter of FIG. 14 as it is exercised by a time-varying load reported by Iload and a time-varying capacitance reported by VC. A steady 100 µH inductance is reported by VL. Vo(t) is substantially steady despite these exercises and ripple is substantially inversely proportional to total output capacitance.

Figure 16:
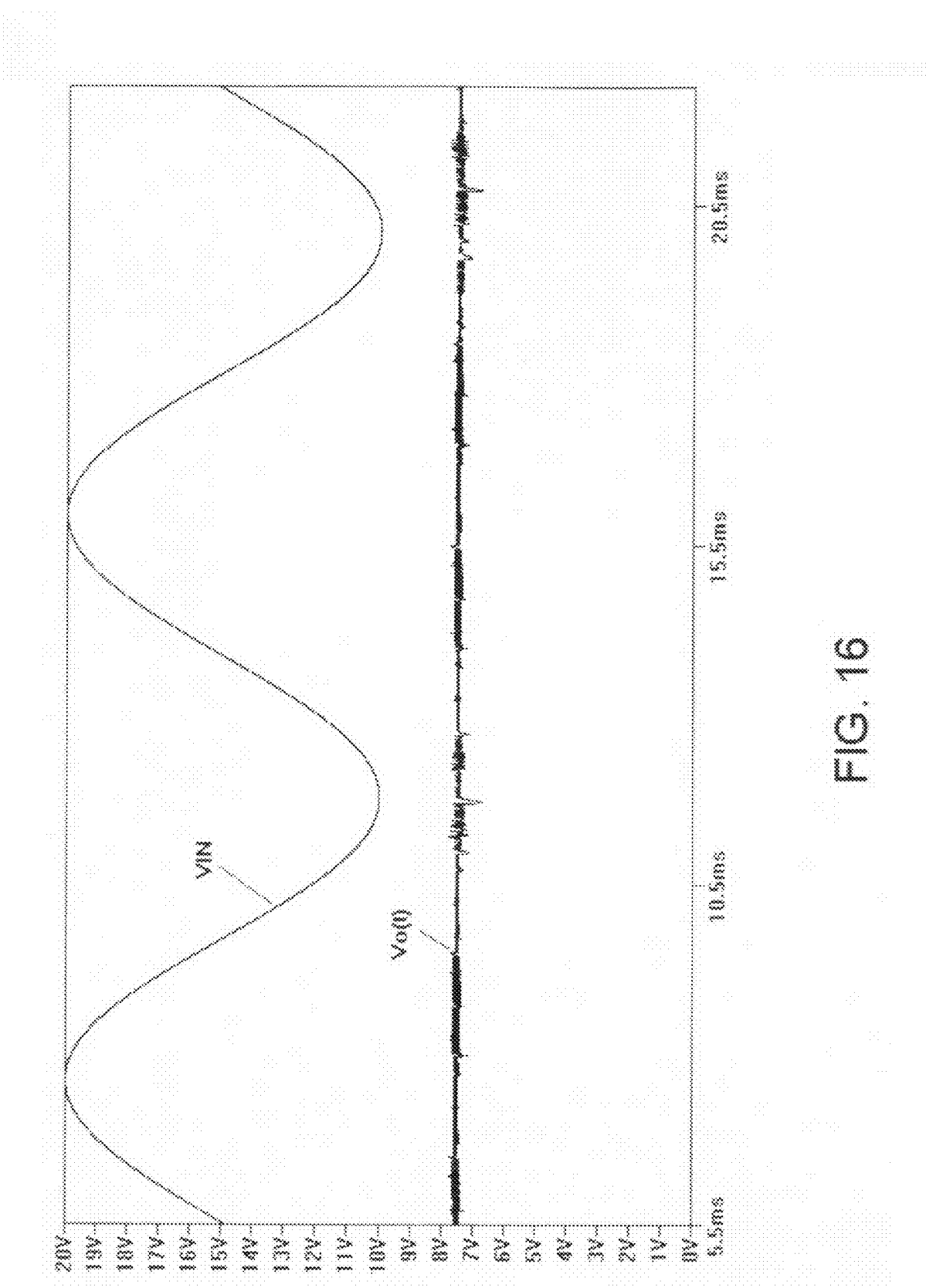
FIG. 16 illustrates the Vo(t) waveform generated by the buck converter of FIG. 14 as it is exercised by a time-varying input voltage.

FIG. 16 illustrates the Vo(t) waveform generated by the buck converter of FIG. 14 as it is exercised by a time-varying input voltage. All of the exercises, load and capacitance, of FIG. 15 are also continuing as may be seen by careful examination of Vo(t). Vo(t) is substantially insensitive to input voltage variations, as shown.

Figure 17:
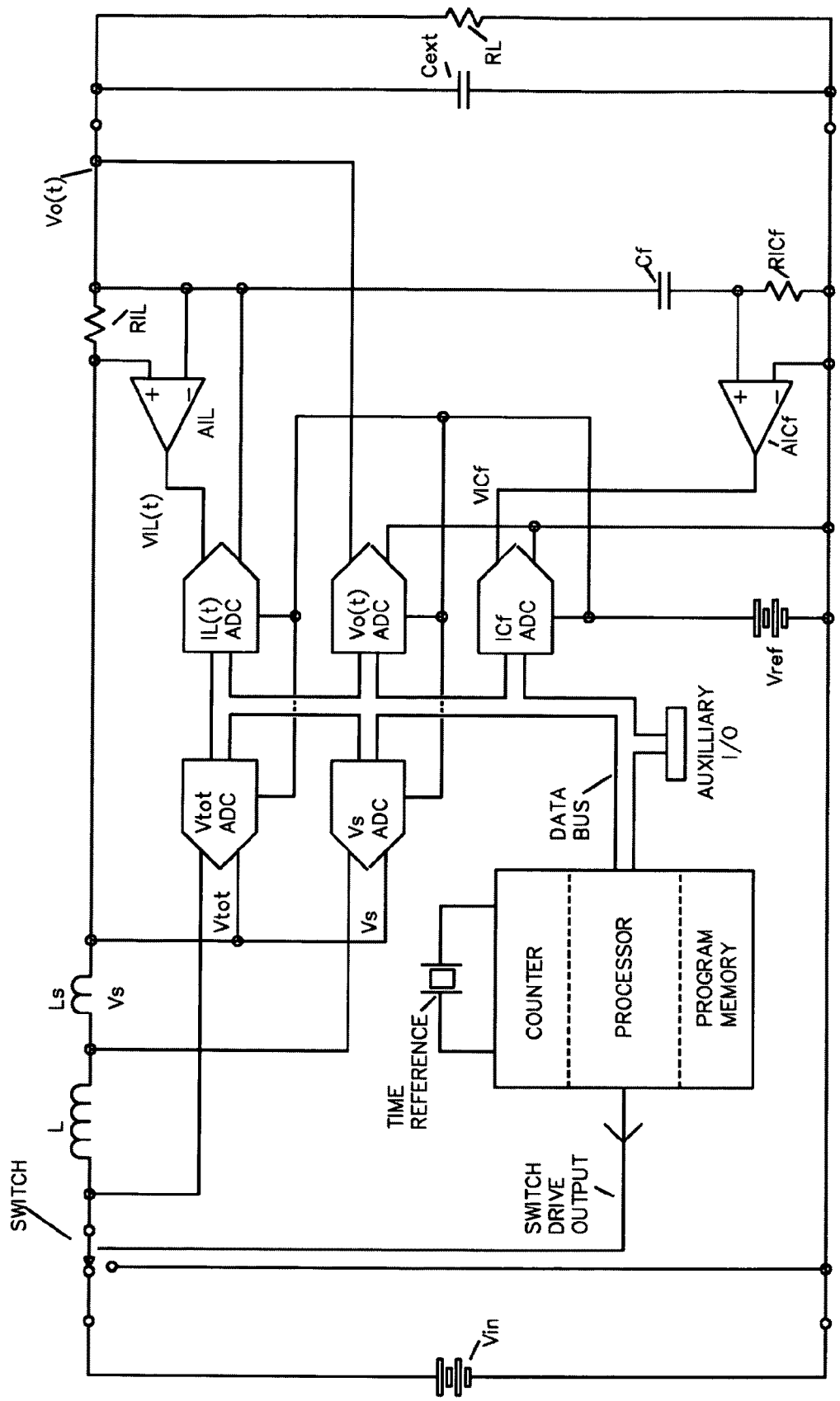
FIG. 17 illustrates a buck converter equivalent to that of FIG. 14, but embodied using digital rather than analog techniques.

FIG. 17 illustrates a buck converter equivalent to that of FIG. 14, but embodied using digital rather than analog techniques. The same computational steps described in FIG. 5 are performed, but the signals described that are handled by a processor are digital numbers rather than being represented by analog voltages or currents. Both analog and digital signals represent the same mathematical quantities.

The input source, switch, inductor, filter capacitance, desired voltage reference, and load illustrated remain identical with those of FIG. 5 and, save splitting up of inductance and capacitance, with prior art.

Since the power conversion waveforms in the reactive components of this regulator inherently appear as analog quantities, it is necessary to convert these analog signals to digital representations that can be manipulated by a digital processor. To this end, inductor current IL is conditioned as in FIG. 5, but then converted to digital form by the IL(T) (A)nalog-to-(D)igital-(C)onverter. The digital numerical value representing IL traverses a data bus and is presented to the processor. Likewise a Vo(t) ADC presents the processor with a signal representing instantaneous regulator output voltage, Vo(t). Similarly, an ICf ADC presents to the processor digital data representing the ripple current flowing in Cf. Vtot and Vs ADC's present digital data to be used as dividend and divisor respectively in the determination of inductance. All ADC's may share a voltage reference that relates all voltage quantities in the calculation according to this invention. If one or more of these ADC's is already equipped with a suitable internal voltage reference, a constant stored in program memory may replace the explicit voltage reference shown.

Since time is part of the energy-balance equations according to this invention, a time reference is provided. The time reference may take the form of a crystal, a ceramic resonator, an R-C circuit, an L-C circuit, a SAW device, or other well known timing device. Unless the execution of the processor's program is tightly related to time, it is usually convenient to use a digital divider, or counter, to provide to the processor a digital word representing time. Said counter may be separately embodied, but is often provided as part of the processor itself, and often includes oscillator circuitry needed to make the time reference device operate.

The processor is useless without a program to execute. Said program, embodying the mathematical relationships described in FIG. 5, resides in a program memory. This program memory may be separately embodied, but is often provided as part of the processor itself. The processor may also include, or be separately provided with, random access memory for temporary data storage.

The processor of this invention may be implemented as a microcontroller, microprocessor, digital signal processor, or as a programmable logic device with or without a well-known "embedded" processor residing in its hardware, firmware, or software. It may or may not also comprise the aforecited program memory, random access memory and counter.

It should be noted, that given the paucity of absolutely vital processor outputs, i.e. the single line driving the switch, the entire processor may be replaced with a memory having some addresses driven by a counter and the balance of its addresses driven by the outputs of the aforementioned ADC's. In this case, each memory address points to a predetermined 1 or 0 in program memory, said memory having been programmed by another computer, the latter having performed in advance, and obtained the results of, the mathematical operations explained relating to FIG. 5.

With a processor it is often convenient to communicate with another processor such data as may be contained in or derived from the mathematical operations performed, and to allow the regulator of this invention to obey instructions from another processor. To this end an auxiliary I/O port is provided.

Figure 18:
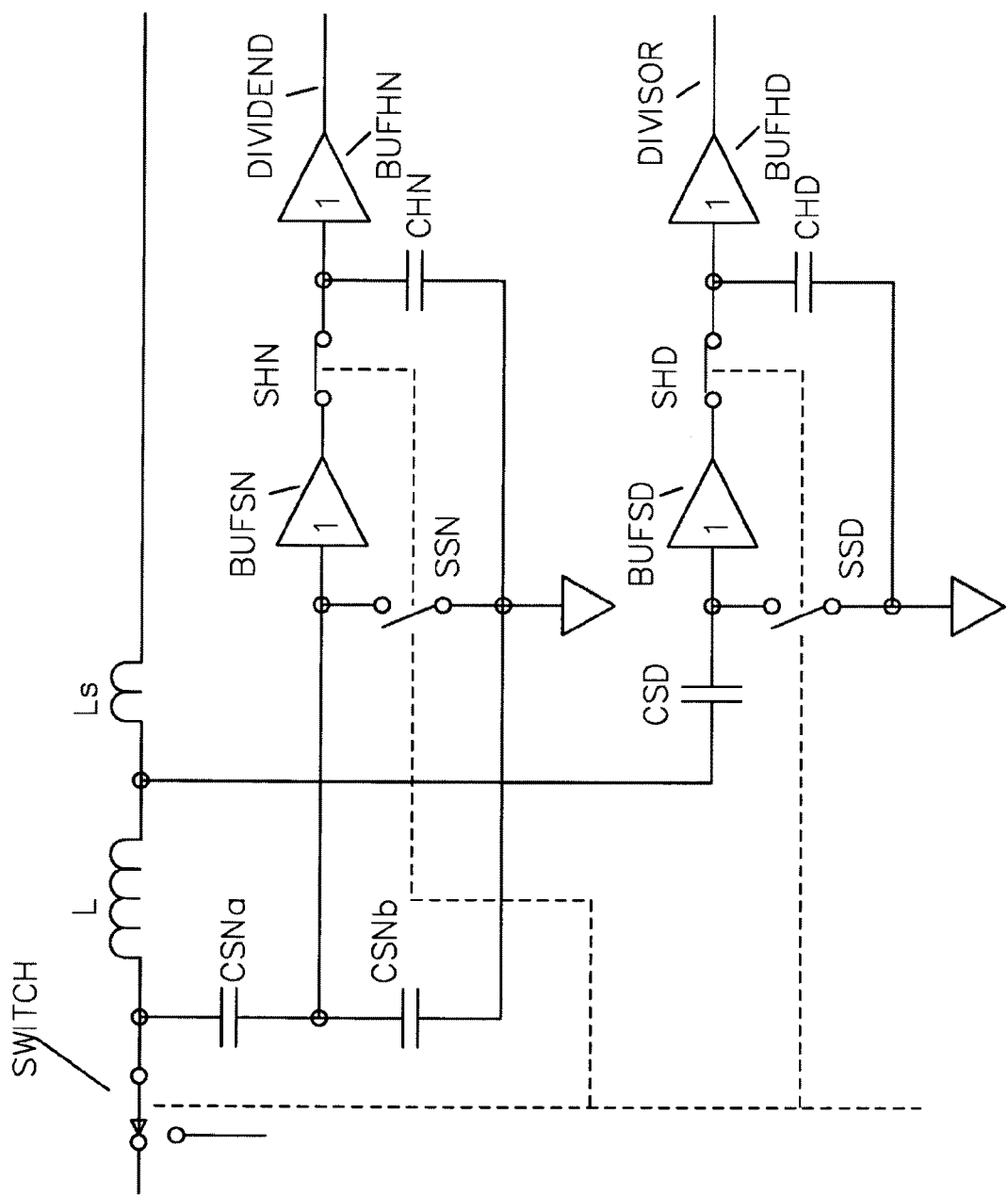
FIG. 18 illustrates AC peak-to-peak to DC voltage converters for use in inductance meters.

FIG. 18 illustrates AC peak-to-peak to DC voltage converters for use in the inductance meters of the buck regulators of FIG. 14 or FIG. 17, and with the inductance meter of flyback regulator FIG. 1.

Inasmuch as it is more difficult to build a bipolar AC ratiometer than a DC ratiometer, it may be desirable to convert the voltages Vtot and Vs across their respective inductances to DC prior to their division by RATIOL. The converter of FIG. 10 performs this conversion function as follows:

Let us first address the simpler case of Vs, the ratiometer divisor, or denominator, in which explanation the suffix "D" will be used for the converter components. When SWITCH is connected to the top of Vin, a positive voltage is applied to L, and a sample of that voltage appears at the node L, Ls, CSD. The same signal that drives SWITCH is holding open switch SSD, said node voltage in sum with any charge across CSD appears at the input of buffer BUFSD, and is passed to its output. Said drive signal is holding closed SHD, charging CHD to a voltage that passes through buffer BUFHD to its output DIVISOR.

When said drive signal switches SWITCH, it also toggles both SSD and SHD, causing the voltage at DIVISOR there to abide. The toggling of SWITCH now causes a relatively negative voltage to appear on node L, Ls, CSD, and switch SSD is now closed. CSD becomes charged positively on its SSD-connected pole. When SWITCH is again toggled, node L, Ls, CSD again rises, again charging CHD, causing DIVISOR to rise to the peak-to-peak value of the excursion of node L, Ls, CSD.

Generating the signal DIVIDEND is entirely analogous, with one exception. In this part of the circuit the suffix "N", for numerator, replaces the suffix "D." The voltage swing at SWITCH is likely to be large compared to that at node L, Ls, CSD, which may cause two problems. One problem is that the dynamic range of the switches SSN and SHN and of the buffers BUFSN and BUFHN may be exceeded. Secondly, if the ratio L/Ls is large, RATIOL, which follows as shown in FIG. 5, may not operate optimally. If however the ratio of the capacitive reactances XCSNa/XCSNb be made equal to L/Ls, ratiometer RATIOL will operate at unity with the nominal L, and large voltages on the switches may be avoided. Any convenient ratio will serve with correct scaling.

RATIOL can be any convenient analog divider, based on the Gilbert-cell, logarithmic BJT behavior, PWM's, multiple slope conversion, or other well-known technique. There is little need for fast response from RATIOL unless intra-cycle dynamic data about the value of L is desired.

The peak-to-peak converters just described can also be used to facilitate digital processing. Again, it is easier to process unipolar DC signals, but there is another advantage. During inductive charging the processor is occupied with predicting energy balance, and any time stolen from this vital activity is likely to delay it, producing energy balance error. However, during inductive discharge the processor is scarcely occupied. The converter operation just described shows the P-P voltage abiding at both DIVIDEND and DIVISOR while SWITCH is discharging L. A stable voltage at these points during the entirety of discharge facilitates sequential analog-to-digital conversions of DIVIDEND and DIVISOR by a single ADC during a time when both the Vo(t) and IL(t) ADC's and the processor are relatively idle. Since with many ADC's unity ratio equals full scale, a different ratio of XCSNa/XCSNb than that best for analog computation may be advantageous.

The peak-to-peak conversion just described may also be implemented by using a separate processor and ADC or ADC's. Some inexpensive processors suitable for this task now include not only both program and random-access memory, but also include ADC's. For such an integrated processor with ADC's can perform inductance measurement and also place the numerical value of inductance on the data bus for the energy predictions of the main processor according to this invention.

Figure 19:
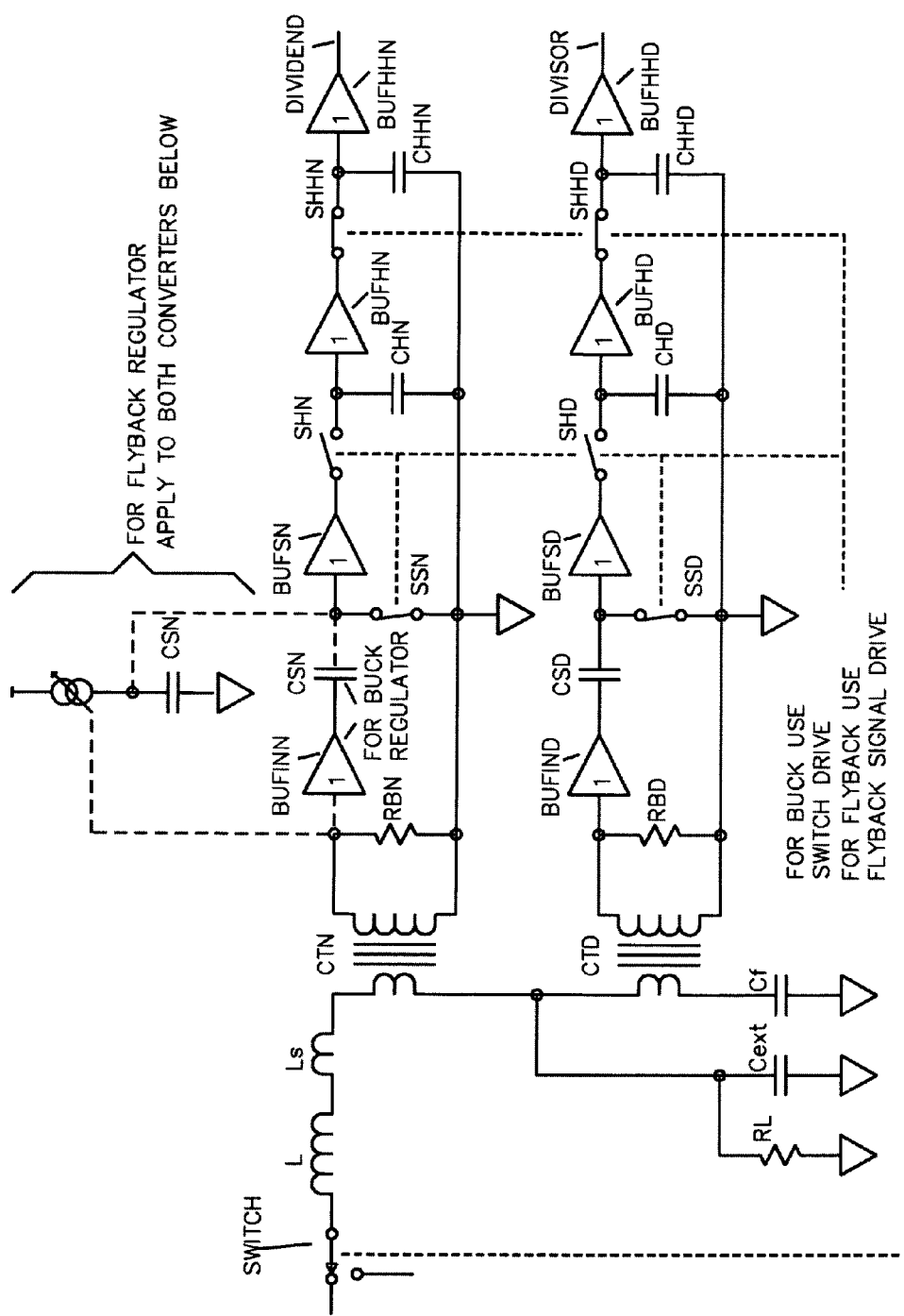
FIG. 19 illustrates AC peak-to-peak to DC voltage converters for use in capacitance meters.

FIG. 19 illustrates AC peak-to-peak to DC voltage converters for use in capacitance meters of the buck regulators of FIG. 14 and/or FIG. 17, and of the flyback regulator of FIG. 1.

The operation of the capacitance meter P-P to DC converters is similar to the operation of those of the inductance meter illustrated in FIG. 18. The suffices "N" and "D" pertain to the dividend and divisor respectively as in FIG. 18.

Though the signals representing total charging current ripple and that portion thereof flowing in Cf may be obtained from sampling resistors and amplifiers, using a high-pass filter to remove low-frequency components of IL, often resistors that are too large for efficient operation or amplifiers of high-gain bandwidth are required to obtain these signals. Since there is usually more than adequate current for signal available in these ripples, the use of current transformers, as shown in this figure, passively to obtain voltage gain whilst minimizing sampling resistance can be advantageous. Moreover, a current transformer provides high-pass filtration. In one embodiment operating with a 20 μS period, a current-transformer L/R time-constant of 200 μS with a turns ratio of 1:100 proved satisfactory.

Since the information in the ripple in Cf is time offset from inductive information, the extra set of sample-hold stages shown, as compared to the inductive P-P converter, is needed to provide a steady capacitive dividend and divisor for an entire switching cycle.

Let us first address the ratiometer divisor, or denominator. A current transformer CTD operating with a burden RBD reflects into its primary a dropping resistance $RBD/N^2$, where N is the transformer turns ratio. The voltage dropped across said invisible but very real resistance is multiplied by N and appears across RBD. BUFIND buffers said multiplied voltage. The AC P-P to DC conversion of the divisor converter is identical to that of its inductive converter counterpart, but polarity of signal depends on both switching phase and current transformer poling. The additional sample-hold comprising SHHD, CHHD, and BUFHHD holds steady the capacitive divisor for an entire switching period instead of a half-period as in the inductive converter. In this converter, dividend operation is identical to divisor operation.

RATIOC can be any convenient analog divider, based on the Gilbert-cell, logarithmic BJT behavior, PWM's, multiple slope conversion, or other well-known technique if sudden changes of capacitance due to such applications as "hot-swapping" are not likely. If quick response to sudden capacitance changes is needed, RATIOC must be a fast enough divider to enable the energy computation quickly to restore energy balance after a sudden change of capacitance. For this purpose a Gilbert-cell divider or a logarithmic divider best serve analog applications, and a digital processor must be sufficiently agile to perform required digital calculations at adequate speed.

The advantages of using a P-P to DC converter for capacitive determination to free up the main processor, and of using an auxiliary processor to perform capacitance determination, are similar to the advantages described for such conversion and auxiliary processing in the inductive case.

The operation of the AC P-P to DC converters of this figure, when applied to a flyback regulator, is substantially the same as described above. The slight difference is that the capacitive currents of the flyback converter may rise nearly instantaneously from zero to a peak value, and then descend toward zero with a substantially linear slope. The converters of this figure, if configured for the buck regulator, would store the ends of these descending sawtooth waves, and exquisite timing might be required to acquire the peaks of these waves. Therefore, for the flyback converter application, voltage controlled current sources feeding shunt capacitors replace the buffers connected to the current transformers. Thus the voltages stored and converted represent the current-time products of said descending sawtooth waves. For the flyback application the flyback time signal of that regulator drives the switches of the converters, rather than SWITCH drive as in the buck application. Since both sawtooth waves share the same duration, their ratio is proportional to the ratio of total output capacitance to internal output capacitance which, properly scaled, yields VC, just as with the capacitance meter of the buck converter.

Figure 20:
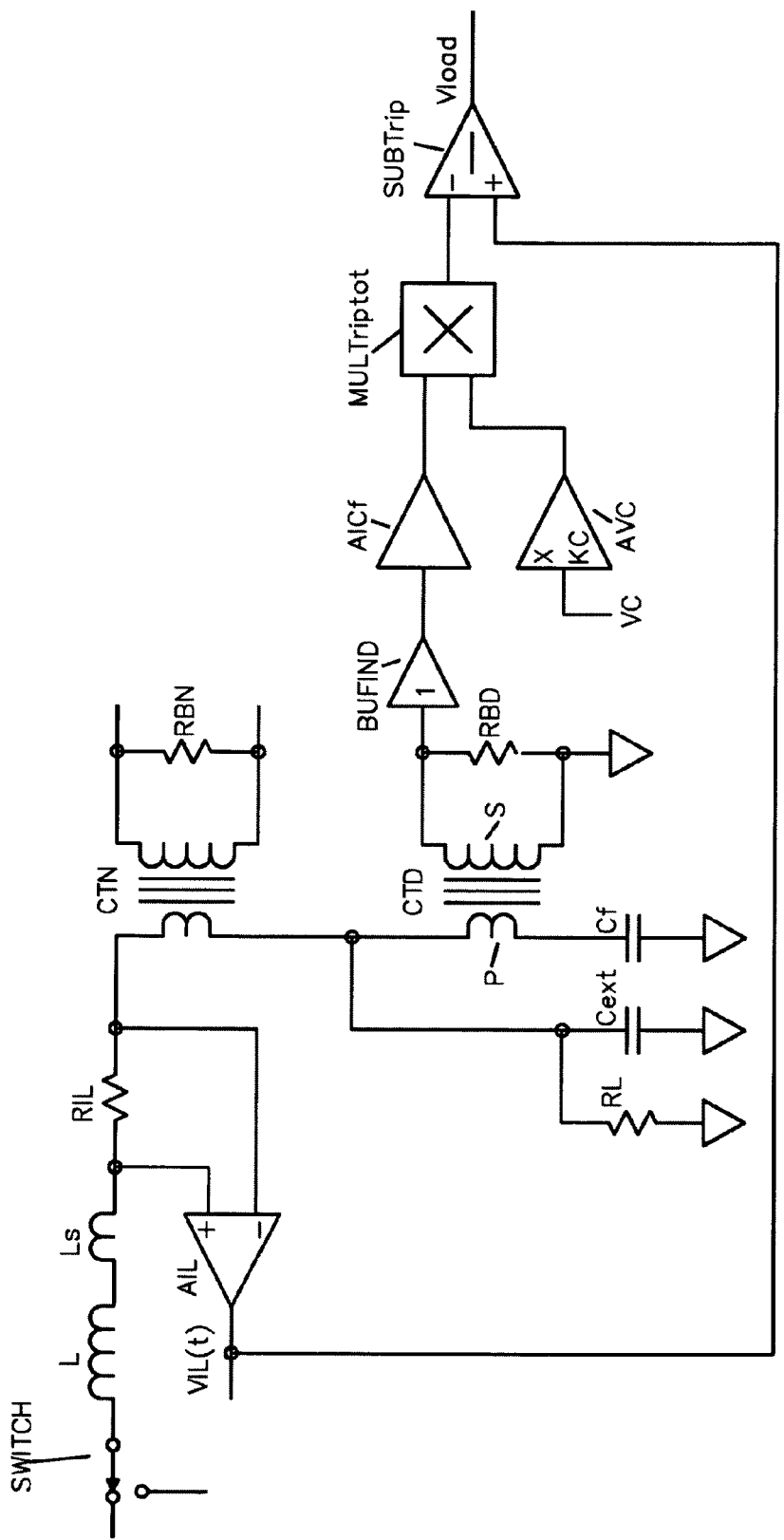
FIG. 20 illustrates a loadmeter for use in buck regulators of the present invention.

FIG. 20 illustrates a loadmeter for use in the buck regulators of FIG. 14 or FIG. 17. This loadmeter extracts from VIL, a signal representing both AC and DC current components in the inductor, a signal representing instantaneous load current. Since load current may change abruptly, necessitating immediate adaptation by the energy predicting computation of this invention, simple filtration of VIL is woefully inadequate for this task. This loadmeter exploits the paths taken when the various components of IL split, to isolate the non-capacitive load current component, thus yielding an instantaneous representation of the DC component thereof.

Loadmeter operation is as follows. The buffered output of CTD, already used for other purposes, is amplified by AICf to provide a ripple signal properly scaled to represent the charging current ripple in Cf in relation to that in IL. If no external capacitance be present, the output of AICf might equal the ripple present in VIL(t). However, if, for example, an external capacitance be present that equals Cf, the ripple in IL splits equally between Cf and said external capacitance. The output of AICf must in this case be doubled to equal the ripple in IL. VC, appropriately scaled by AVC, which may have a gain greater than, equal to, or less than unity, depending on Cf value and VC scaling, provides, in this case, the value 2 to multiplier MULTriptot to make a ripple signal equal to that in IL, i.e., a signal representing total charging ripple. Subtractor SUBTrip subtracts said total ripple from VIL(t) yielding an instantaneous representation of load current. Since the ripple in the external capacitance represented by the portion of the output of MULTriptot that is in excess of the output of AICf is also subtracted from VIL(t), that current does not appear in Vload. The effect of this load meter is to do implicitly that which will usually be impractical to do explicitly, that is to measure separately load current within the load, splitting for exclusion from other current within the load itself the current in the load's own capacitance.

It might at first glance appear that the output of CTN, which contains total ripple, might more directly yield Vload, obviating the need for MULTriptot. However, the current in the primary of CTN, unlike that in the primary P of CTD, contains the instantaneous value of load current. The frequency response of the inductance of CTN with RBN does not provide sufficient filtration to remove said load current component. Therefore the use CTN for this purpose would require a relatively complex and costly filter, which could be employed to practice this invention. However exploiting paths by using CTD to derive Vload as shown is simpler, and is presently the preferred method.

Figure 21:
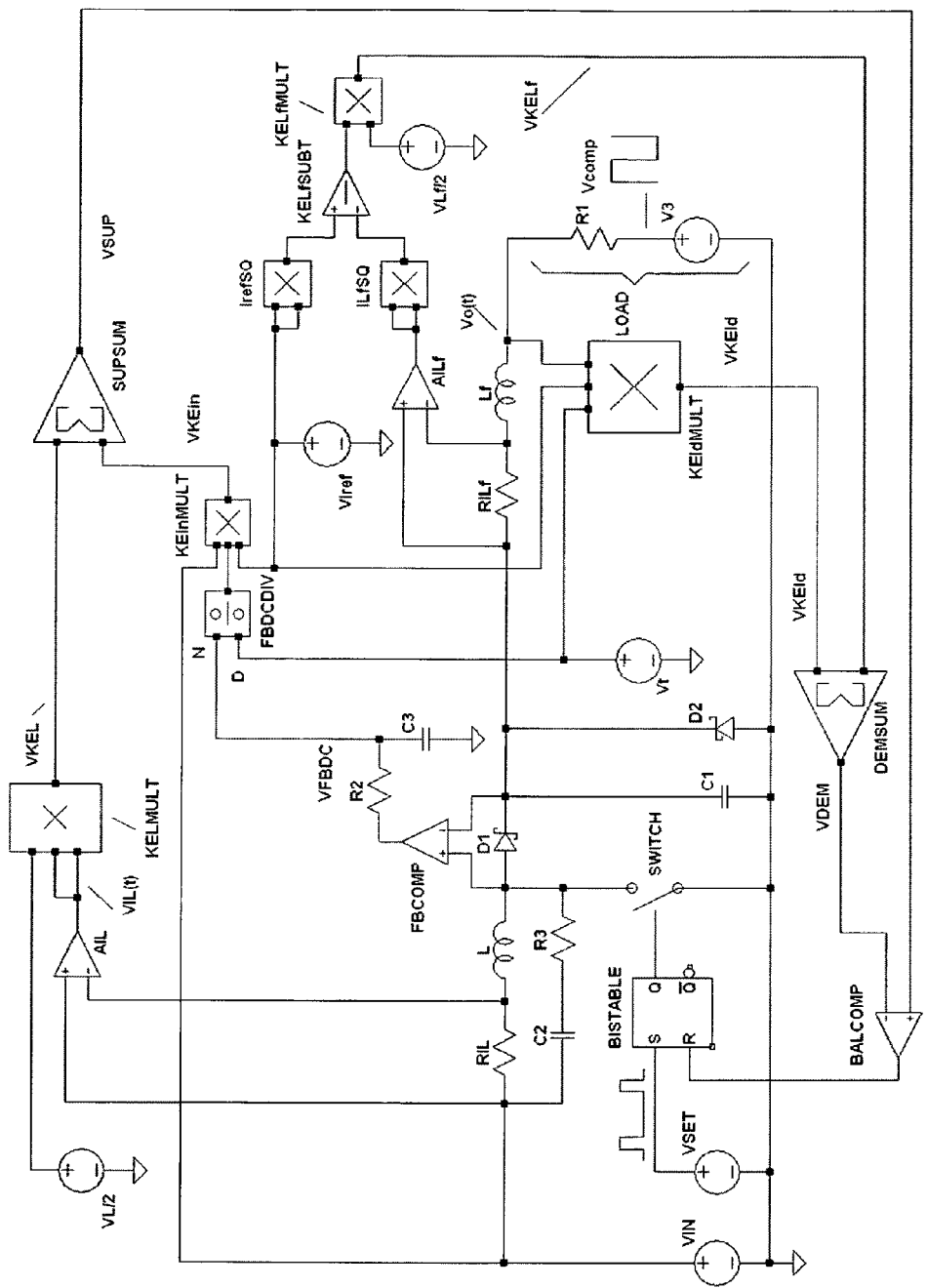
FIG. 21 illustrates a current-output regulator according to the present invention.

FIG. 21 illustrates a synchronous flyback switching current-source regulator according to this invention. The generation of the energy signal, VKEL, of its switched inductor is substantially the same as that of FIG. 1, explained above. As in FIG. 1, there is a signal, VKEin, representing the energy from VIN during flyback time. Comparator FBCOMP produces a pulse representing flyback time which, filtered by R2 and C3 produces a signal, VFBDC, representing the flyback time. Divider FBDCDIV divides VFBDC by Vt, the latter DC signal representing the time of the chopping cycle to produce a correctly scaled time signal relating to the flyback duty-cycle. Multiplier KEinMULT multiplies the output of FBDCDIV by VIN and by Iref to estimate VKEin. Summer SUPSUM adds VKEL to VKEin to produce the signal VSUP, representing total per-cycle supply energy, just as in FIG. 1.

Just as in FIG. 1, part of the energy that must be supplied is that consumed by the load, which is the product of chopping period time, Vt, output voltage V0(t), and output current, Iref. Accordingly KEldMULT multiplies these signals to produce the signal VKEld. Just as the filter capacitance of a voltage regulator can store much energy, so also can the filter inductor Lf of this embodiment. This energy is analogous to the KEC energy of FIG. 1, and similarly computed. IrefSQ squares VIref to provide a signal representing Iref^2. A voltage drop across RILf represents the instantaneous current in Lf, which when amplified by AILf and squared by ILfSQ represents the square of the Lf current. Subtractor KELfSUBT, subtracts the latter from the former to produce a signal proportion to the energy that must be supplied to charge Lf to the desired current in the present chopping cycle. KELfMULT and VLf/2 correctly scale this signal to produce VKELf, representing energy required to charge Lf. Summer DEMSUM adds VKEin and VKELf to predict total per cycle energy demand. Signals for diode losses, if appropriate, may be added as in FIG. 1. When per-cycle energy supply equals or exceeds demand, comparator BALCOMP resets BISTABLE, terminating charging of L, just as in FIG. 1.

At the appropriate time, VSET then sets BISTABLE to commence the next chopping cycle.

The load shown includes a compliance exercising signal Vcomp to exercise the compliance of the current source aspect of this embodiment.

Figure 22:
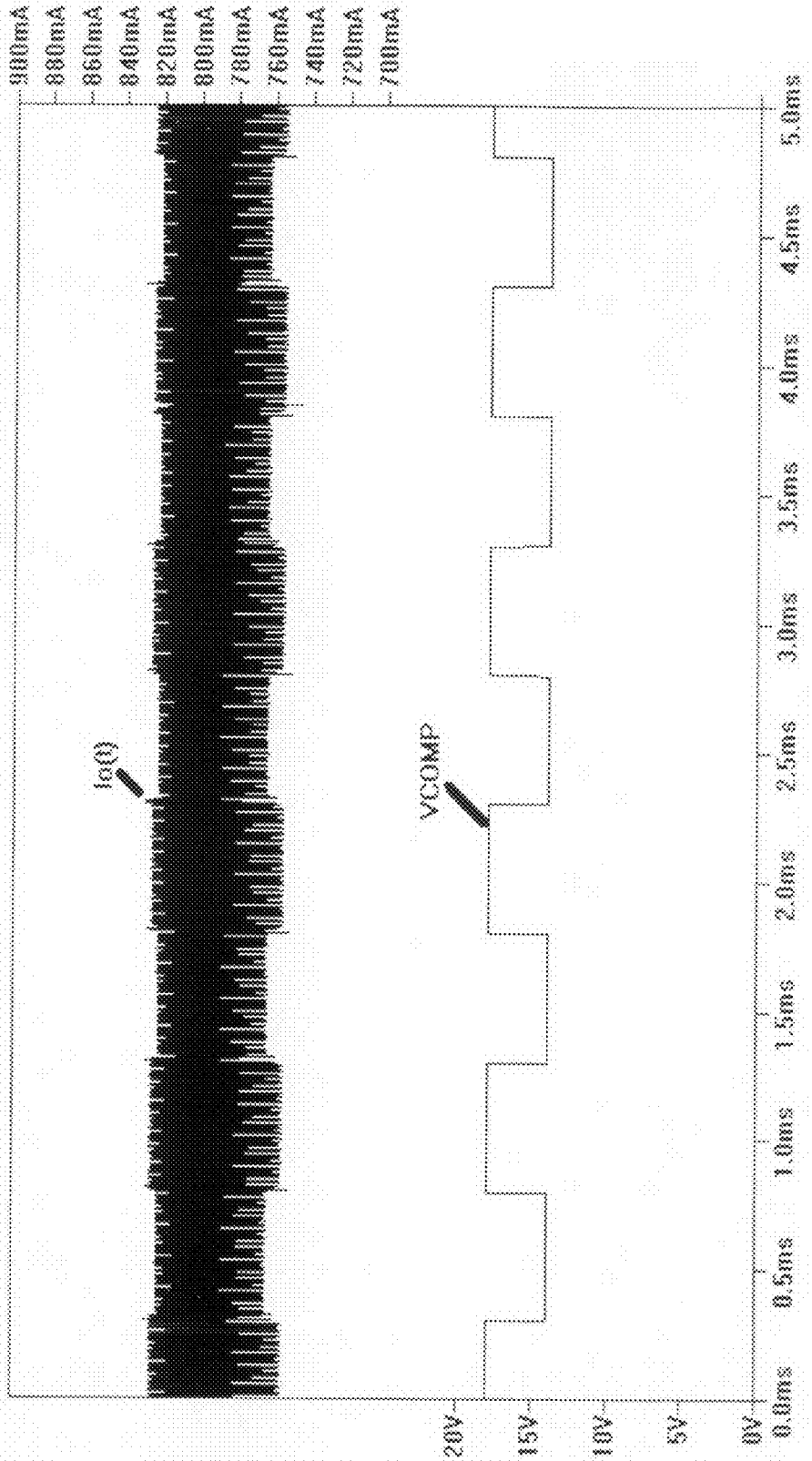
FIG. 22 shows the current output waveform of the regulator of FIG. 21.

FIG. 22, shows the current output waveform of the embodiment of FIG. 21 as it is exercised by a square wave of 4V P-P. The ripple of Io(t) is analogous to the ripple of Vo(t) of FIG. 1. This embodiment displays the excellent transient response characteristic of regulators according to this invention.

In the embodiments described thus far the inductive reactor for storing energy has been an inductor or a transformer, however any inductive reactor, such as flywheels or motors may be used, whether now known or later invented, and are included within the scope of this invention.

It is understood that the invention is not limited to the disclosed embodiments, but on the contrary, is intended to cover various modifications and equivalent arrangements included within the spirit and scope of the appended claims. Without further elaboration, the foregoing will so fully illustrate the invention, that others may by current or future knowledge, readily adapt the same for use under the various conditions of service.

We claim:

1. A power-conversion regulator comprising;
an input adapted to receive energy from an energy source;

an inductive reactor for temporary energy storage;
an output reactor for output filtration;
an output adapted to supply energy to a load;
a reference signal to which the output is compared to provide a desired output; and
control circuitry for controlling the charging of the inductive reactor so that the amount of energy placed into the inductive reactor during inductive reactor charging is based approximately upon a per-chopping-cycle load energy requirement.

2. The regulator of claim 1 wherein the per-chopping-cycle load energy requirement is based upon prediction of said requirement.

3. The regulator of claim 1 wherein the amount of energy placed into the inductor to satisfy the per-chopping-cycle load energy requirement is controlled in response to measured inductive reactor magnetic flux, predicted inductive reactor magnetic flux, measured inductive reactor current, or predicted inductive reactor current.

4. The regulator of claim 1 further comprising flux-determining circuitry to produce a flux signal having a known mathematical relationship to the energy held in the inductive reactor's magnetic field.

5. The regulator of claim 4 further comprising output signal-conditioning circuitry to produce an output signal having a known mathematical relationship to the voltage or current at said regulator's output.

6. The regulator of claim 4 wherein the flux-determining circuitry_comprises a Hall-effect sensor, a GMR sensor, or a circuit to sense current in the inductive reactor.

7. The regulator of claim 6, wherein the flux-determining circuitry is a circuit to sense current in the inductive reactor which is further comprised of a sampling resistor in series with the inductive reactor, a current transformer having one winding in series with the inductive reactor, or a current mirror.

8. The regulator of claim 1, wherein said regulator comprises flux-determining circuitry that computes the field of said inductive reactor based on the voltage-time product having been applied to the inductive reactor.

9. The regulator of claim 8, wherein said flux-determining circuitry is used to adjust the time duration of application of an input voltage to correct the amount of energy being placed into the inductive reactor.

10. The regulator of claim 1, wherein said regulator is a DC-to-DC power converter, an AC-to-AC power converter, an AC-to-DC power converter, or a DC-to-AC power converter.

11. The regulator of claim 1, wherein said regulator is synchronous or asynchronous.

12. The regulator of claim 1, wherein said regulator regulates a flyback, buck, boost or sepic type power converter.

13. The regulator of claim 1 wherein the inductive reactor is an inductor, transformer, motor or flywheel.

14. The regulator of claim 1 wherein the regulator is a single-phase or multiphase power converter.

15. The regulator of claim 1, wherein the control circuitry is digital or analog.

16. The regulator of claim 1, comprising circuitry for determining total output capacitance, said circuitry being an explicit capacitance meter or implicitly calculating capacitance based on other measured values in the regulator.

17. The regulator of claim 1, comprising circuitry for determining its internal inductance, said internal inductance being determined by an explicit inductance meter or implicitly calculated based on other measured values in the regulator.

18. The regulator of claim 1, comprising circuitry for determining its load current, in the presence or absence of load reactance.

19. The regulator of claim 18 comprising at least one current transformer.

20. The regulator of claim 1, comprising circuitry for predicting energy to be consumed by a load during any fraction of a chopping period.

21. The regulator of claim 1 wherein the control circuit includes computational circuitry driving at least one switch, the switch controlling charging of the inductive reactor.

22. The regulator of claim 21 wherein the switch is a MOSFET, IGBT, BJT, thyristor, or saturable reactor.

23. The regulator of claim 21 wherein the switch is optically, electromagnetically, or galvanically isolated from the computational circuitry.

24. The regulator of claim 1 wherein the output reactor is substantially capacitive or inductive.

* * * * *